United States Patent
So et al.

(10) Patent No.: US 10,248,239 B2
(45) Date of Patent: Apr. 2, 2019

(54) TOUCH SENSOR INTEGRATED TYPE DISPLAY DEVICE AND METHOD OF OPERATING THE SAME

(71) Applicant: LG Display Co., Ltd., Seoul (KR)

(72) Inventors: Byeongseong So, Gyeonggi-do (KR); Kyujin Kim, Gyeonggi-do (KR); Taehun Kim, Gyeonggi-do (KR); Seungjin Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/630,182

(22) Filed: Jun. 22, 2017

(65) Prior Publication Data
US 2018/0004329 A1    Jan. 4, 2018

(30) Foreign Application Priority Data
Jun. 30, 2016  (KR) .................. 10-2016-0082698

(51) Int. Cl.
| | |
|---|---|
| G06F 3/041 | (2006.01) |
| G02F 1/1333 | (2006.01) |
| G09G 3/36 | (2006.01) |
| G06F 3/044 | (2006.01) |
| G02F 1/1343 | (2006.01) |

(Continued)

(52) U.S. Cl.
CPC ........ G06F 3/0412 (2013.01); G02F 1/13338 (2013.01); G02F 1/134309 (2013.01); G06F 3/044 (2013.01); G06F 3/0416 (2013.01); G09G 3/20 (2013.01); G09G 3/3648 (2013.01); G09G 3/3677 (2013.01); G11C 19/287 (2013.01); G09G 2300/0408 (2013.01);
(Continued)

(58) Field of Classification Search
None
See application file for complete search history.

(56) References Cited

U.S. PATENT DOCUMENTS

| | | | |
|---|---|---|---|
| 2012/0139883 A1 | 6/2012 | Lee et al. | |
| 2014/0085285 A1* | 3/2014 | Kim | .............. G09G 3/3266 345/211 |

(Continued)

OTHER PUBLICATIONS

Extended European Search Report dated Nov. 27, 2017, issued in corresponding European Application No. 17178320.2.

*Primary Examiner* — Joseph R Haley
*Assistant Examiner* — Emily J Frank
(74) *Attorney, Agent, or Firm* — Morgan, Lewis & Bockius LLP

(57) ABSTRACT

A touch sensor integrated type display device includes: a display panel including: pixels connected to data lines and gate lines and division-driven into a plurality of panel blocks, and a plurality of touch sensors connected to the pixels, a display driving circuit providing data of an input image to the pixels in multiple display periods divided from one frame period, and a touch sensing circuit driving the touch sensors and sensing a touch input in a touch sensing period allocated between the display periods of the frame period, adjacent panel blocks being division-driven in the display periods that are separated from each other with the touch sensing period, in which the touch sensors are driven, interposed therebetween, the display driving circuit including a shift register: shifting a gate pulse in accordance with a shift clock timing, and sequentially supplying the gate pulse to the gate lines.

16 Claims, 22 Drawing Sheets

(51) Int. Cl.
  *G09G 3/20* (2006.01)
  *G11C 19/28* (2006.01)
(52) U.S. Cl.
  CPC ............... *G09G 2310/0267* (2013.01); *G09G 2310/0286* (2013.01); *G09G 2310/08* (2013.01)

(56) References Cited

U.S. PATENT DOCUMENTS

| | | |
|---|---|---|
| 2014/0267156 A1 | 9/2014 | Koga et al. |
| 2015/0346904 A1* | 12/2015 | Long .................... G09G 3/3677 345/174 |
| 2016/0049126 A1 | 2/2016 | Zhang et al. |

* cited by examiner

TOUCH SENSOR INTEGRATED TYPE DISPLAY DEVICE AND METHOD OF OPERATING THE SAME

CROSS-REFERENCE TO RELATED APPLICATIONS

This application claims the priority of Korean Application No. 10-2016-0082698, filed on Jun. 30, 2016, the entirety of which is hereby incorporated by reference.

BACKGROUND

1. Technical Field

The present disclosure relates to a display device, and, more particularly, to a touch sensor integrated type display device and a method of operating the same.

2. Discussion of the Related Art

Flat panel displays (hereinafter referred to as "display devices"), which can be manufactured as a large-sized display device at a low price and excellent in display quality (including motion picture representation, resolution, brightness, contrast ratio, color representation, etc.), have been actively developed in accordance with a need for display devices capable of properly displaying multimedia together with the development of multimedia. Various input devices, such as a keyboard, a mouse, a track ball, a joystick, and a digitizer, have been used in the display devices to allow users to interface with the display devices. However, when the user makes use of these input devices, the user's dissatisfaction may increase because the user may be required to learn how to use the input devices, and the input devices occupy space, thereby decreasing desirability of products. Thus, a demand for a convenient and simple input device for the display device capable of reducing erroneous operation has increased. In response to the increased demand, a touch sensor has been proposed to recognize information when the user inputs information by directly touching the screen or approaching the screen with his or her hand or a pen while he or she watches the display device.

FIGS. 1 and 2 illustrate a display drive and a touch sensing drive on a per block basis in accordance with a related art.

The touch sensors used in the display device may be implemented through an in-cell technology in which they are embedded inside a display panel. A display device using in-cell technology may share a touch electrode of a touch sensor and a common electrode of a display panel with each other, and may time-divide one frame into a display period and a touch sensing period. For example, as shown in FIG. 1, a display panel may be divided into a plurality of panel blocks PB1 and PB2, and a display drive and a touch sensing drive may be performed on each of the panel blocks PB1 and PB2. For example, data of an input image may be written to pixels of the first panel block PB1 during a first display period Td1, and then touch sensors may be driven to sense a touch input during a first touch sensing period Tt1. Subsequently, data of the input image may be written to pixels of the second panel block PB2 during a second display period Td2, and then the touch sensors may be driven to sense a touch input during a second touch sensing period Tt2.

During a display period, a gate driver may sequentially shift a gate pulse applied to gate lines using a shift register. The gate pulse may sequentially select pixels to be charged with a data signal in synchronization with the data signal of the input image on a per line basis. The shift register of the gate driver may include cascade-connected stages. The cascade-connected stages of the shift register each receive a start pulse or an output of a preceding stage and charge a Q node. When the display period is not divided, all the stages of the shift register may have the same Q node charging period (hereinafter, referred to as a "Q standby period") of about two horizontal periods.

However, as shown in FIG. 2, when the display period is divided based on the number of blocks and the touch sensing period is allocated between the divided display periods, a Q node of a stage, which generates a first output immediately after the touch sensing period, is discharged by a length of the touch sensing period, and generates a low output. In the case of a full high definition (FHD) display device, one horizontal period is about 6.0 µs, and a touch sensing period is about 100 µs. Thus, a Q standby period of a stage, which generates a first output immediately after the touch sensing period, is about 100 µs or more, and a Q standby period of other stages of the shift register is about 12.0 µs. Because a discharge time of the Q node increases as the Q standby period of the Q node becomes longer, a line dim phenomenon appears on a first line, at which the display period again starts immediately after the touch sensing period.

SUMMARY

Accordingly, the present disclosure is directed to a touch sensor integrated type display device and a method of operating the same that substantially obviate one or more of the issues due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a touch sensor integrated type display device, including: a display panel including: pixels connected to data lines and gate lines and division-driven into a plurality of panel blocks, and a plurality of touch sensors connected to the pixels, a display driving circuit configured to provide data of an input image to the pixels in a plurality of display periods divided from one frame period, and a touch sensing circuit configured to drive the touch sensors and sense a touch input in a touch sensing period allocated between the display periods of the one frame period, wherein adjacent panel blocks of the display panel are division-driven in the display periods that are separated from each other with the touch sensing period, in which the touch sensors are driven, interposed therebetween, wherein the display driving circuit includes a shift register configured to: shift a gate pulse in accordance with a shift clock timing, and sequentially supply the gate pulse to the gate lines, wherein an $i^{th}$ stage of the shift register includes: a first pull-up transistor configured to increase a voltage of a first output terminal in response to a voltage of a Q node, a first pull-down transistor configured to discharge the voltage of the first output terminal to a first low potential voltage in response to a voltage of a QB node, a first transistor configured to charge the Q node in response to a voltage of a start pulse input terminal, and a Q node discharge controller including at least one transistor configured to control a current path between the Q node and a variable low potential voltage line, where "i" is a natural number, and wherein the variable low potential voltage line is configured to receive a high potential voltage during at least a portion of the touch sensing period.

In another aspect, there is provided a method of operating a touch sensor integrated type display device including a display panel including pixels connected to data lines and gate lines and division-driven into a plurality of panel blocks and a plurality of touch sensors connected to the pixels, the method including: providing, by a display driving circuit, data of an input image to the pixels in a plurality of display periods divided from one frame period, driving the touch sensors and sensing a touch input in a touch sensing period allocated between the display periods of the one frame period, by a touch sensing circuit, division-driving adjacent panel blocks of the display panel in the display periods that are separated from each other with the touch sensing period, in which the touch sensors are driven, interposed therebetween, by a shift register in the display driving circuit: shifting a gate pulse in accordance with a shift clock timing, and sequentially supplying the gate pulse to the gate lines, increasing a voltage of a first output terminal in response to a voltage of a Q node, by a first pull-up transistor in an $i^{th}$ stage of the shift register, where "i" is a natural number, discharging the voltage of the first output terminal to a first low potential voltage in response to a voltage of a QB node, by a first pull-down transistor in the $i^{th}$ stage of the shift register, charging the Q node in response to a voltage of a start pulse input terminal, by a first transistor in the $i^{th}$ stage of the shift register, controlling a current path between the Q node and a variable low potential voltage line, by a Q node discharge controller including at least one transistor in the $i^{th}$ stage of the shift register, and receiving, by the variable low potential voltage line, a high potential voltage during at least a portion of the touch sensing period.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
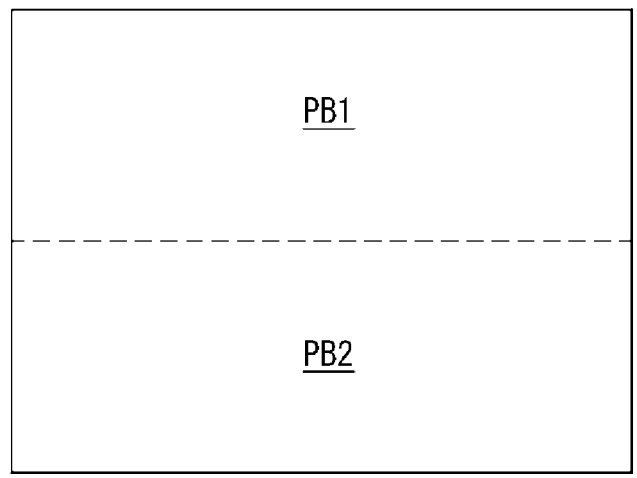
FIGS. 1 and 2 illustrate a display drive and a touch sensing drive on a per block basis in accordance with a related art.
Figure 2:
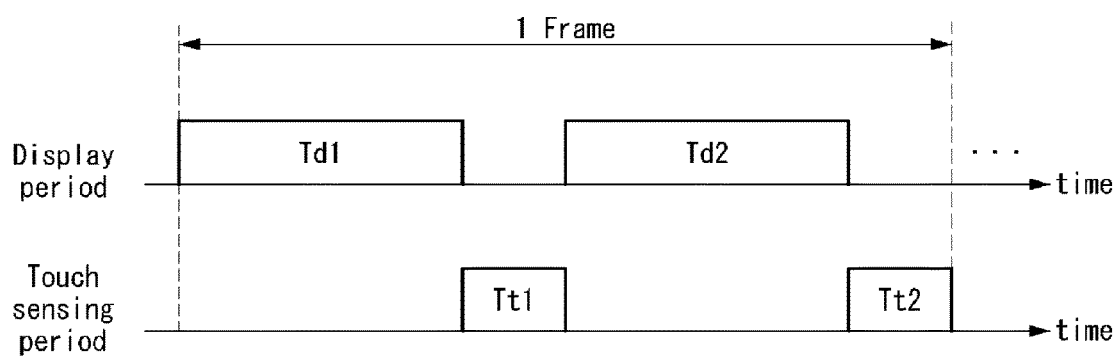

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Switching elements of a gate driver according to embodiments may be implemented as transistors of n-type or p-type metal oxide semiconductor field effect transistor (MOSFET) structure. In embodiments disclosed herein, n-type transistors are described by way of example. However, embodiments are not limited thereto, and other types of transistors may be used. The transistor is a three-electrode element including a gate, a source, and a drain. The source is an electrode for supplying carriers to the transistor. The carriers inside the transistor may begin to flow from the source. The drain is an electrode from which the carriers exit the transistor. For example, carriers in the MOSFET flow from the source to the drain. In case of an n-type MOSFET (NMOS), because carriers are electrons, a source voltage is less than a drain voltage so that electrons can flow from a source to a drain. In the n-type MOSFET, because electrons flow from the source to the drain, a current flows from the drain to the source. In case of a p-type MOSFET (PMOS), because carriers are holes, a source voltage is greater than a drain voltage so that holes can flow from a source to a drain. In the p-type MOSFET, because holes flow from the source to the drain, a current flows from the source to the drain. In embodiments disclosed herein, the source and the drain of the MOSFET are not fixed. For example, the source and the drain of the MOSFET may be changed, depending on an applied voltage. The following embodiments relate to the source and the drain of the transistor.

A touch sensor according to embodiments may be implemented as a capacitive touch sensor, which is able to be embedded in a pixel array, for example, a mutual capacitance touch sensor or a self-capacitance touch sensor. In the following description, embodiments will be described using a self-capacitance touch sensor as an example. However, embodiments are not limited thereto, and other types of touch sensors may be used.

Figure 3:
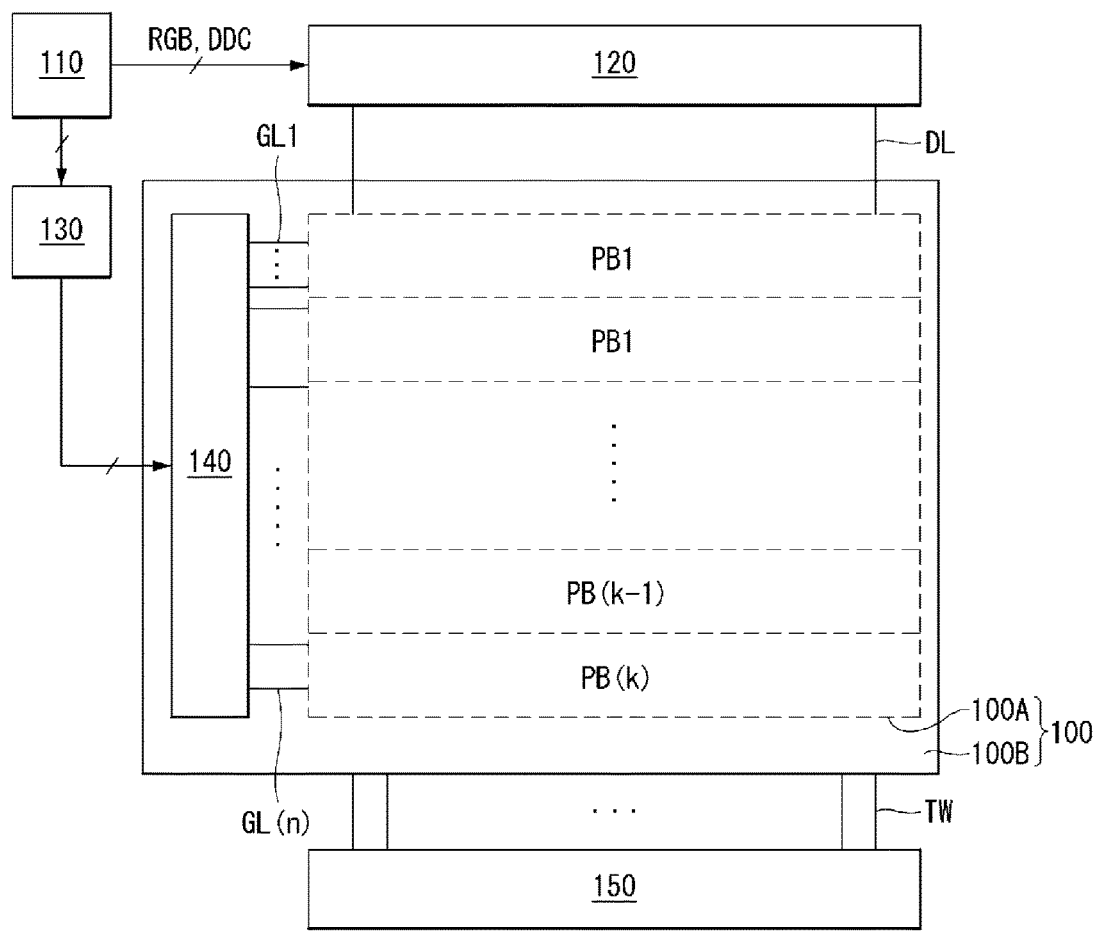
FIG. 3 illustrates a display device according to an example embodiment.
Figure 4:
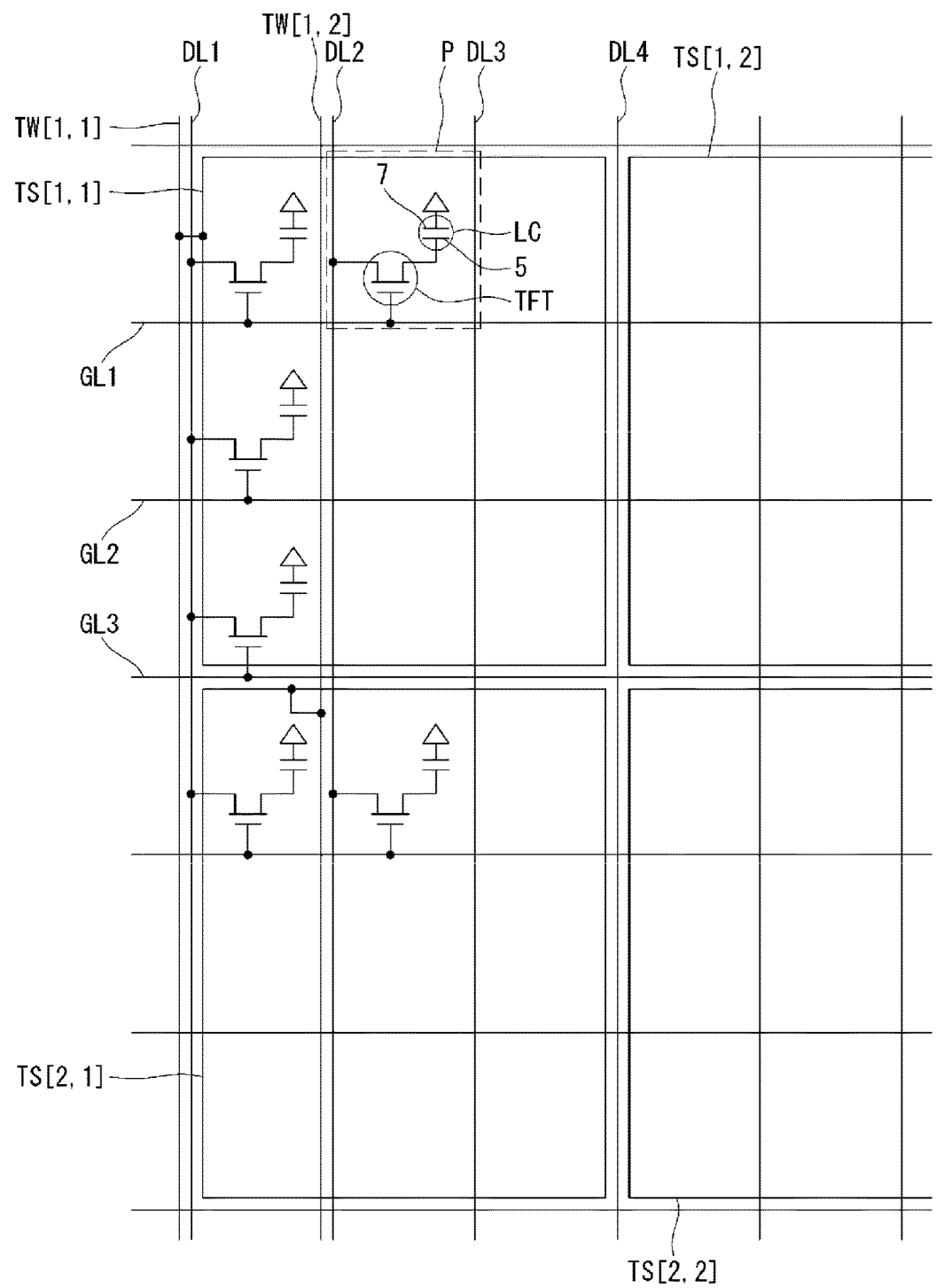
FIG. 4 illustrates a portion of a pixel array according to an example embodiment.
Figure 5:
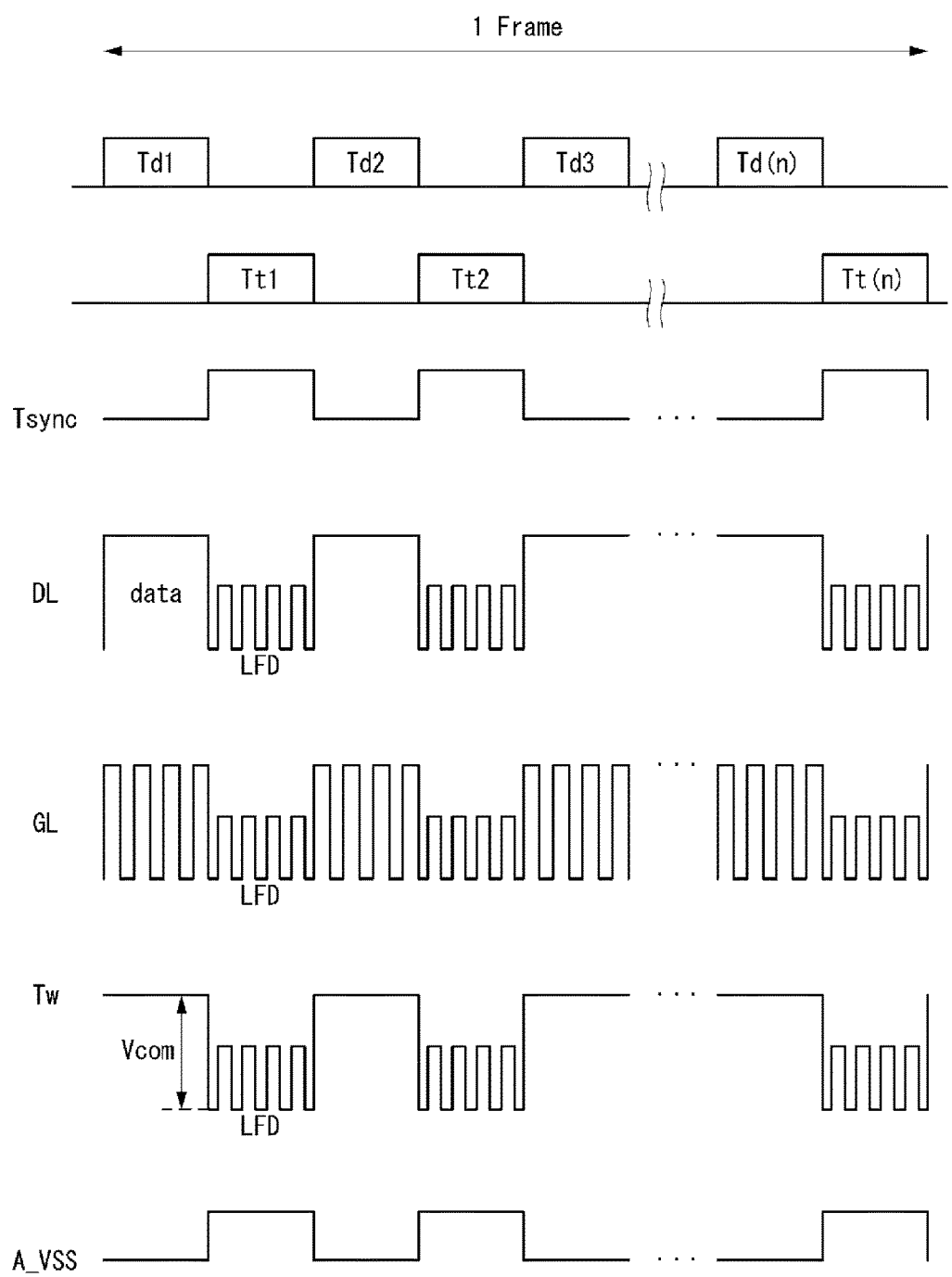
FIG. 5 illustrates driving signals according to an example embodiment.

FIG. 3 illustrates a display device according to an example embodiment. FIG. 4 illustrates a portion of a pixel array according to an example embodiment. FIG. 5 illustrates driving signals according to an example embodiment.

FIG. 3 illustrates a touch sensor integrated type display device according to an example embodiment. FIG. 4 illustrates pixels included in a touch senor according to an example embodiment. FIG. 5 illustrates signals output to signal lines by a driving circuit. In the FIGS. 3 and 4 examples, the respective touch sensors and the respective sensing lines are designated with a separate reference numeral. However, in the following description, the touch sensors and the sensing lines will be commonly referred to as a "touch sensor TS" and a "sensing line TW" when they are described without distinguishing their positions.

With reference to FIGS. 3 to 5, a touch sensor integrated type display device according to an example embodiment may include a display panel 100, a timing controller 110, a data driver 120, a level shifter 130, a shift register 140, and a touch sensing circuit 150. The display panel 100 may include a display unit (or area) 100A and a non-display unit (or area) 100B. The display unit 100A may include pixels P for displaying image information and touch sensors TS. The non-display unit 100B may be disposed outside the display unit 100A.

The display unit 100A may be divided into k panel blocks PB1 to PB(k). Each of the panel blocks PB1 to PB(k) may display an image, and may perform a touch sensing drive. Each of the panel blocks PB1 to PB(k) may include a plurality of horizontal lines HL. For example, a first panel block PB1 may include first to $(i-1)^{th}$ gate lines GL1 to GL(i-1).

A pixel array of the display panel 100 may include data lines DL, gate lines GL, thin film transistors TFT formed at crossings of the data lines DL and the gate lines GL, pixel electrodes 5 connected to the thin film transistors TFT, storage capacitors (Cst) connected to the pixel electrodes 5, and the like. The thin film transistor TFT may be turned on in response to a gate pulse from the gate line GL, and may supply a data voltage, applied through the data line DL, to the pixel electrode 5. A liquid crystal layer LC may be driven by a voltage difference between the data voltage charged to the pixel electrode 5 and a common voltage VCOM applied to a touch common electrode 7 and controls an amount of light transmitted.

The touch sensors TS may be connected to the plurality of pixels P, and may be implemented as capacitive touch sensors to sense a touch input. Each touch sensor TS may include the plurality of pixels P. FIG. 4 illustrates an example in which nine pixels P arranged in a 3×3 matrix are assigned to one touch sensor TS. However, embodiments are not limited thereto. In the illustrated example, because the touch common electrode 7 may be divided based on each touch sensor TS, an area occupied by the touch common electrode 7 may be referred to as the "touch sensor TS." The touch sensors TS may be respectively connected to sensing lines TW. For example, a sensing line TW[1, 1] of a first row and a first column may be connected to a touch sensor TS [1, 1] of the first row and the first column; and a sensing line TW[1, 2] of the first row and a second column may be connected to a touch sensor TS [1, 2] of the first row and the second column. The touch common electrode 7 may receive a reference voltage (e.g., the common voltage VCOM) of the pixels P during a display period, and may receive a touch sensing signal LFD during a touch sensing period.

The non-display unit 100B may be disposed outside the display unit 100A, and a driving circuit IC for driving the data lines DL. The gate lines GL may be disposed in the non-display unit 100B.

The timing controller 110 may transmit data of an input image received from a host system (not shown) to the data driver 120. The timing controller 110 may receive timing signals, such as a vertical sync signal Vsync, a horizontal sync signal Hsync, and a data enable signal DE, from the host system in synchronization with the data of the input image. The timing controller 110 may generate a data timing control signal for controlling operation timing of the data driver 120 and a gate timing control signal for controlling operation timing of the gate drivers (e.g., the level shifter 130 and the shift register 140) based on the timing signals. The timing controller 110 may synchronize a display driving circuit with the touch sensing circuit 150.

The display driving circuit may include the data driver 120 and the first and second gate drivers (e.g., the level shifter 130 and the shift register 140), and may provide the data of the input image to the pixels P of the display panel 100. The display driving circuit may time-divide one frame period into a plurality of display periods and a plurality of touch sensing periods, and may provide the data of the input image to the pixels P on a per block basis in the display period.

The data driver 120 may receive image data from the timing controller 110, and may convert the image data into positive and negative gamma compensation voltages to output (provide) positive and negative data voltages. The data driver 120 may then supply the positive and negative data voltages to the data lines DL.

The first and second gate drivers 130 and 140 may sequentially supply the gate pulses to the gate lines GL under the control of the timing controller 110. The gate pulse output (provided) from the gate driver may be synchronized with the data voltage. The first and second gate drivers 130 and 140 may include the level shifter 130 and the shift register 140, which may be connected between the timing controller 110 and the gate lines of the display panel 100. The level shifter 130 may level-shift transistor-transistor-logic (TTL) level voltages of gate clocks CLK input from the timing controller 110 to a gate high voltage VGH and a gate low voltage VGL. The shift register 140 may include stages that shift a start signal VST in accordance with the gate clock CLK, and may sequentially output (provide) gate pulses Gout.

The touch sensing circuit 150 may drive the touch sensors TS in response to a touch enable signal Tsync received from the timing controller 110 or the host system during the touch sensing period. The touch sensing circuit 150 may supply a touch driving signal Vac to the touch sensors TS through the sensor lines TW to sense a touch input during the touch sensing period. The touch sensing circuit 150 may analyze a change amount of charges of the touch sensor, which may vary depending on the presence or absence of a touch input, and may determine the touch input. The touch sensing circuit 150 may calculate coordinates of a position of the touch input, and may transmit coordinate information of the touch input position to the host system.

FIG. 5 is a timing diagram illustrating a driving signal of the touch sensor integrated type display device according to an example embodiment.

With reference to FIGS. 3 to 5, one frame may include k display periods Td and k touch sensing periods Tt. The display periods Td and the touch sensing periods Tt may alternate with each other. During a first display period Td1, image data may be provided (e.g., written) to a first panel block PB1. During a first touch sensing period Tt1, the touch sensors TS inside the first panel block PB1 may be driven.

During the first display period Td1, the display driving circuit (e.g., elements 120, 130, and 140) may provide current frame data to pixels of the first panel block PB1, and may update an image reproduced on the first panel block PB1 to the current frame data.

During the first display period Td1, remaining panel blocks PB2 to PBk, other than the first panel block PB1, may hold previous frame data, and the touch sensing circuit 150 may not drive the touch sensors. Subsequently, during the first touch sensing period Tt1, the touch sensing circuit 150 may sequentially drive all the touch sensors, may sense a touch input, may generate a touch report including coordinate information and identification information of each touch input, and may transmit the touch report to the host system.

Subsequently, during a second display period Td2, the display driving circuit (e.g., elements 120, 130, and 140) may provide current frame data to pixels of a second panel block PB2, and may update an image reproduced on the second panel block PB2 to the current frame data. During the second display period Td2, the first panel block PB1 may hold current frame data, and the touch sensing circuit 150 may not drive the touch sensors. Subsequently, during a second touch sensing period Tt2, the touch sensing circuit 150 may sequentially drive all the touch sensors, may sense a touch input, may generate a touch report including coordinate information and identification information of each touch input, and may transmit the touch report to the host system.

During the touch sensing period Tt, the touch sensing circuit 150 may supply a sensor driving signal to the touch sensor through the sensing lines TW, may detect an amount of charges of the touch sensor before and after the touch input, may compare the amount of charges with a threshold voltage, and may determine the touch input. The touch sensing circuit 150 may transmit coordinate information of a touch input to the host system in each touch sensing period Tt. Thus, a touch report rate may be greater than a frame rate. The frame rate is a frame frequency at which an image of one frame is provided (e.g., written) to the pixel array. The touch report rate is a speed at which the coordinate information of the touch input is generated. As the touch report rate increases, a coordinate recognition rate of the touch input increases. Hence, touch sensitivity may be improved.

During the touch sensing period Tt, the data driver 120 may supply an AC signal (referred to herein as a "load free drive (LFD)" signal) having the same phase and the same voltage as a sensor driving signal to the data lines DL, to reduce a parasitic capacitance between the pixels P and the touch sensors TS. When there is no voltage difference between the two ends of a parasitic capacitance between the data lines DL and the touch sensors TS, a magnitude of the parasitic capacitance may be minimized. Thus, when the sensor driving signal is supplied to the touch sensor TS, the magnitude of the parasitic capacitance between the data lines DL and the touch sensors TS can be minimized when the LFD signal having the same phase and the same voltage as the sensor driving signal is supplied to the data lines DL.

In a similar manner as the data driver 120, during the touch sensing period Tt, the gate driver (e.g., elements 130 and 140) may supply an LFD signal having the same phase and the same voltage as a sensor driving signal to the gate lines GL, to reduce a parasitic capacitance between the pixels P and the touch sensors TS. When there is no voltage difference between the two ends of a parasitic capacitance between the gate lines GL and the touch sensors TS, a magnitude of the parasitic capacitance may be minimized. Thus, when the sensor driving signal is supplied to the touch sensor TS, the magnitude of the parasitic capacitance between the gate lines GL and the touch sensors TS can be minimized when the LFD signal having the same phase and the same voltage as the sensor driving signal is supplied to the gate lines GL.

The touch sensing circuit 150 can minimize a parasitic capacitance between the adjacent touch sensors by supplying the LFD signal to the sensor lines other than the sensor lines connected to the touch sensors sensing a current touch input. When the LFD signal having the same phase as the sensor driving signal is supplied to the data lines DL and the gate lines GL of the display panel 100 and the touch sensors, which are not currently connected, during the touch sensing period Tt, an amount of charges of a parasitic capacitance of the display panel 100 may decrease. This is because the amount of charges of the parasitic capacitance can be minimized by minimizing a voltage difference between the two ends of the parasitic capacitance. Due to a decrease in the parasitic capacitance of the touch sensor, the touch sensing circuit 150 can improve a signal-to-noise ratio ("SNR" or "S/N") of the sensor driving signal, may increase an operating margin of the touch sensing circuit 150, and may improve the touch input and the touch sensitivity.

Figure 6:
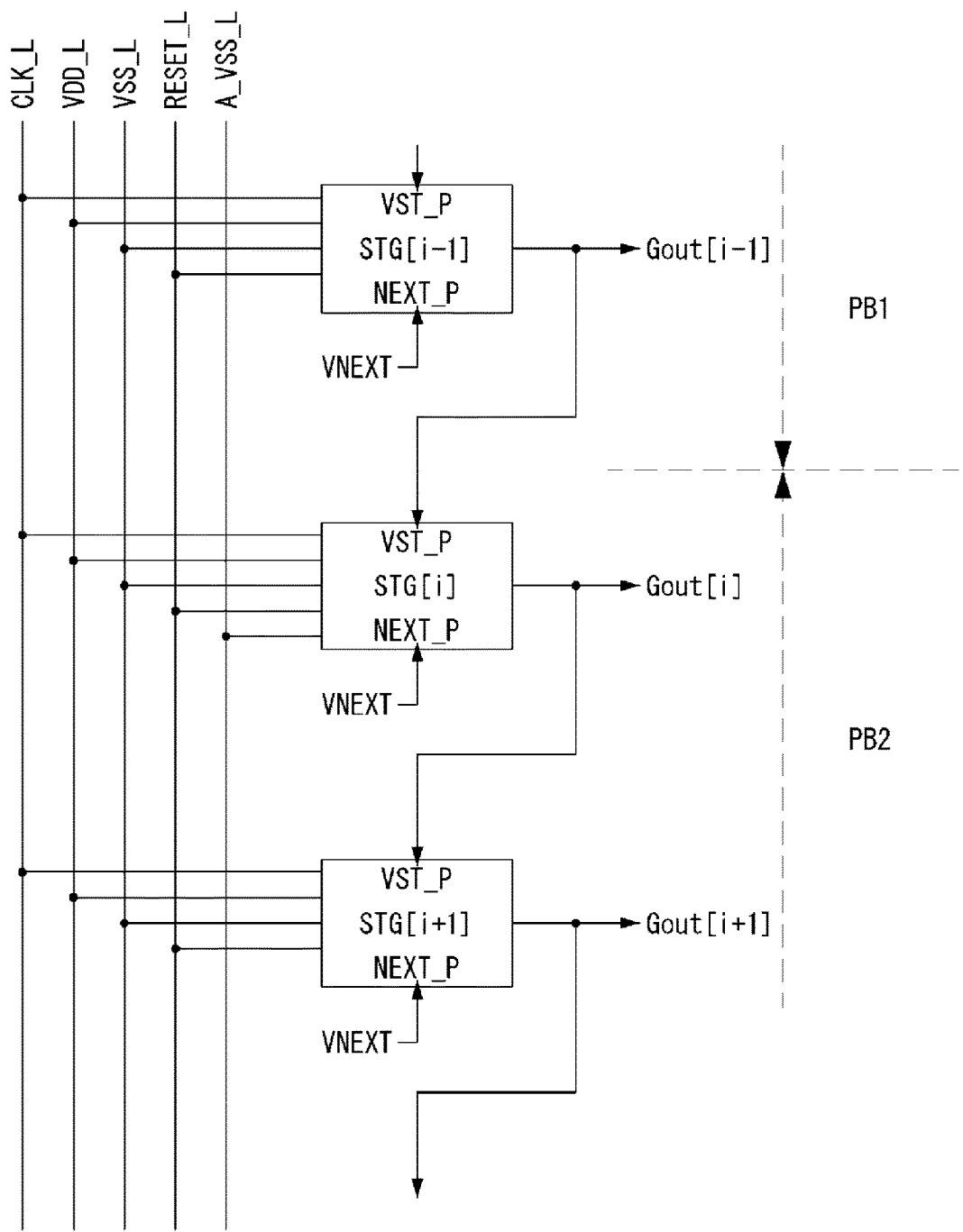
FIG. 6 illustrates configuration of a shift register according to a first example embodiment.

FIG. 6 illustrates configuration of a shift register according to a first example embodiment.

In the FIG. 6 example, an $(i-1)^{th}$ stage STG[i−1] is a last stage of the first panel block PB1, and an $i^{th}$ stage STG[i] is a first stage of the second panel block PB2. With reference to FIG. 6, the shift register 140 may output a gate pulse in response to gate clocks CLK and a start pulse VST. The shift register 140 may include a plurality of cascade-connected stages. In the following description, a "preceding stage" is a stage positioned ahead of (or before) a reference stage. For example, when the $i^{th}$ stage STG[i] is determined as a reference stage, the preceding stage is one of first to $(i-1)^{th}$ stages ST1 to STG[i−1], where "i" is a natural number. Further, a "subsequent stage" is a stage positioned behind (or after) the reference stage. For example, when the $i^{th}$ stage STGi is determined as the reference stage, the subsequent stage is one of $(i+1))^{th}$ stage STG[i+1] to $n^{th}$ stage.

Each stage STG of the shift register 140 may sequentially output gate pulses Gout[1] to Gout[n]. For example, the $i^{th}$ stage STG[i] may output an $i^{th}$ gate pulse Gout[i]. To this end, each stage STG may receive one of the gate clocks CLK that may be sequentially delayed. An $(i-1)^{th}$ gate pulse Gout[i−1] may be applied to an $(i-1)^{th}$ gate line, and at the same time may serve as a carry signal transmitted to the $i^{th}$ stage STG[i]. Further, an $(i+1)^{th}$ gate pulse Gout[i+1] may be applied to an $(i+1)^{th}$ gate line, and at the same time may serve as a next signal NEXT applied to the $i^{th}$ stage STG[i]. The carry signal and the next signal NEXT are not limited thereto and may be implemented by various methods.

FIG. 6 illustrates the $(i-1)^{th}$ stage STG[i−1] belonging to the first panel block PB1, and illustrates the $i^{th}$ stage STG[i] and the $(i+1)^{th}$ stage STG[i+1] belonging to the second panel block PB2. The $(i-1)^{th}$ stage STG[i−1] and the $(i+1)^{th}$ stage STG[i+1] may discharge a node of the stage through a low potential voltage line VSS_L. On the other hand, the $i^{th}$ stage STG[i] may be connected to a variable low potential voltage line A_VSS_L and the low potential voltage line VSS_L. Similarly to the $i^{th}$ stage STG[i], a first stage of each panel block PB may be connected to the variable low potential voltage line A_VSS_L and the low potential voltage line VSS_L.

Figure 7:
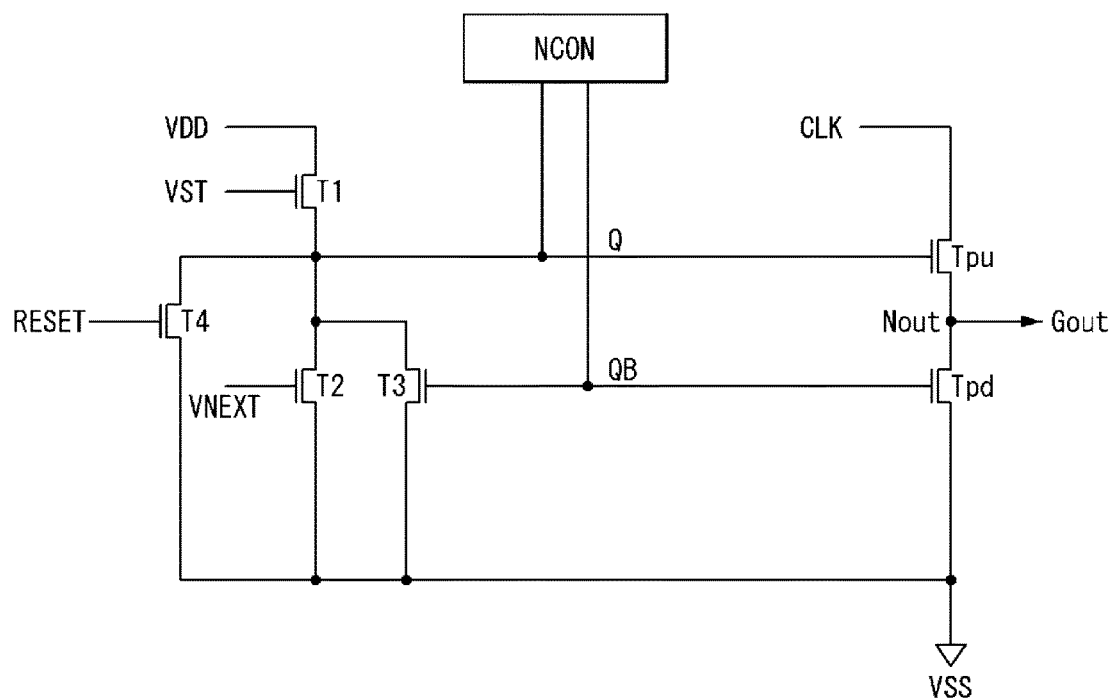
FIG. 7 illustrates a stage according to a comparative example.
Figure 8:
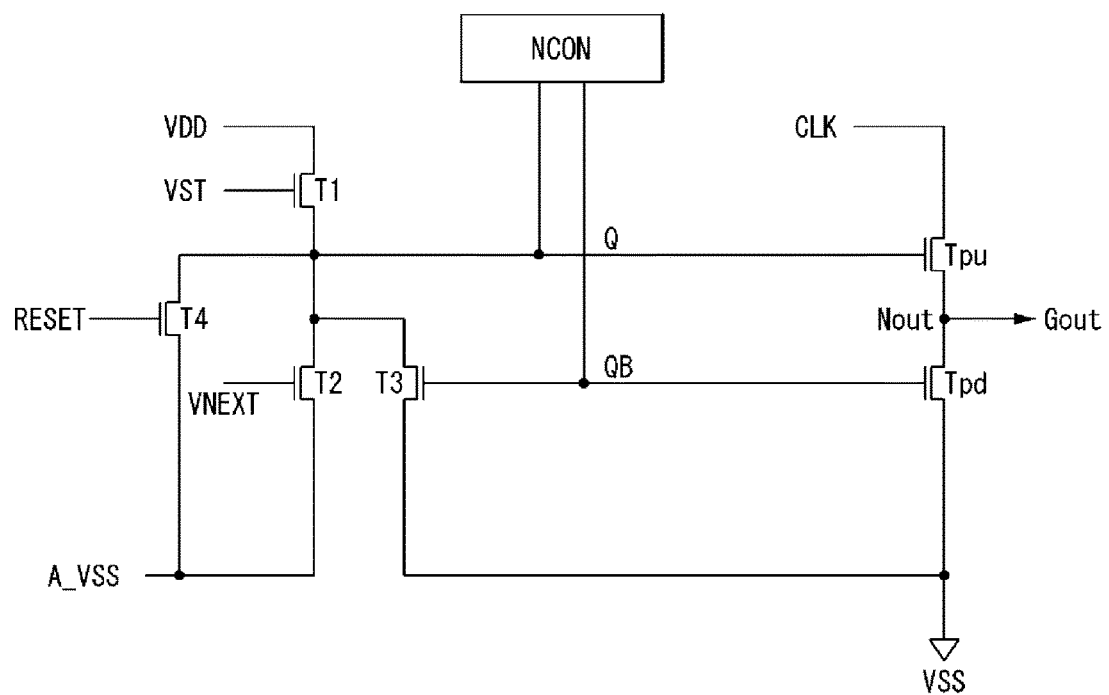
FIG. 8 illustrates a stage according to a first example embodiment.

FIG. 7 illustrates a stage according to a comparative example. FIG. 8 illustrates a stage according to a first example embodiment.

FIG. 7 illustrates an $(i-1)^{th}$ stage, and FIG. 8 illustrates an $i^{th}$ stage. Embodiments relate to a stage for preventing a Q node from being discharged during the touch sensing period Tt. FIG. 8 illustrates a first example embodiment of an $i^{th}$ stage. In embodiments disclosed herein, a first stage of the panel block is referred to as an "$i^{th}$ stage," and embodiments will be described focusing on the $i^{th}$ stage.

With reference to FIGS. 6 to 8, an $i^{th}$ stage STG[i] according to a first example embodiment may include a pull-up transistor Tpu, a pull-down transistor Tpd, a first transistor T1, Q node discharge controllers T2 and T4, a third transistor T3, and a node control circuit NCON. The pull-up transistor Tpu may output an $i^{th}$ gate pulse Gout[i] in accordance with a voltage of a Q node. The pull-down transistor Tpd may discharge a voltage of an output terminal Nout to a low potential voltage VSS when a QB node is charged.

The first transistor T1 may include a gate electrode connected to a start signal input terminal VST_P, a drain electrode connected to a high potential voltage line VDD_L, and a source electrode connected to the Q node. The start signal input terminal VST_P may receive a start pulse VST or an $(i-1)^{th}$ gate pulse Gout[i−1]. The first transistor T1 may charge the Q node corresponding to the start signal input terminal VST_P.

The Q node discharge controllers T2 and T4 may include at least one transistor for controlling a current path between the Q node and the variable low potential voltage line A_VSS_L. The Q node discharge controllers T2 and T4 according to the first embodiment may include a first discharge controller T2 and a second discharge controller T4.

The first discharge controller T2 may include a gate electrode connected to a next signal input terminal VNEXT_P, a drain electrode connected to the Q node, and a source electrode connected to the variable low potential voltage line A_VSS_L. The next signal input terminal VNEXT_P may receives an $(i+1)^{th}$ gate pulse Gout[i+1] or a next signal VNEXT. The first discharge controller T2 may turn on a current path between the Q node and the variable low potential voltage line A_VSS_L in accordance with a voltage of the next signal input terminal VNEXT_P.

The second discharge controller T4 may include a gate electrode connected to a reset line RESET_L, a drain electrode connected to the Q node, and a source electrode connected to the variable low potential voltage line A_VSS_L. The second discharge controller T4 may turn on a current path between the Q node and the variable low potential voltage line A_VSS_L in response to a reset signal RESET. The reset signal RESET may be applied to the driving circuit, for example, the timing controller 110 positioned outside the display panel 100. A timing of the reset signal RESET may be the same as a timing of the next signal VNEXT.

The third transistor T3 may include a gate electrode connected to the QB node, a drain electrode connected to the Q node, and a source electrode connected to the low potential voltage line VSS_L. The third transistor T3 may discharge a voltage of the Q node to the low potential voltage VSS when the QB node is charged.

The node control circuit NCON may stabilize or control the voltage of the Q node or the voltage of the QB node. Any known configuration may be used for the node control circuit NCON.

Figure 9:
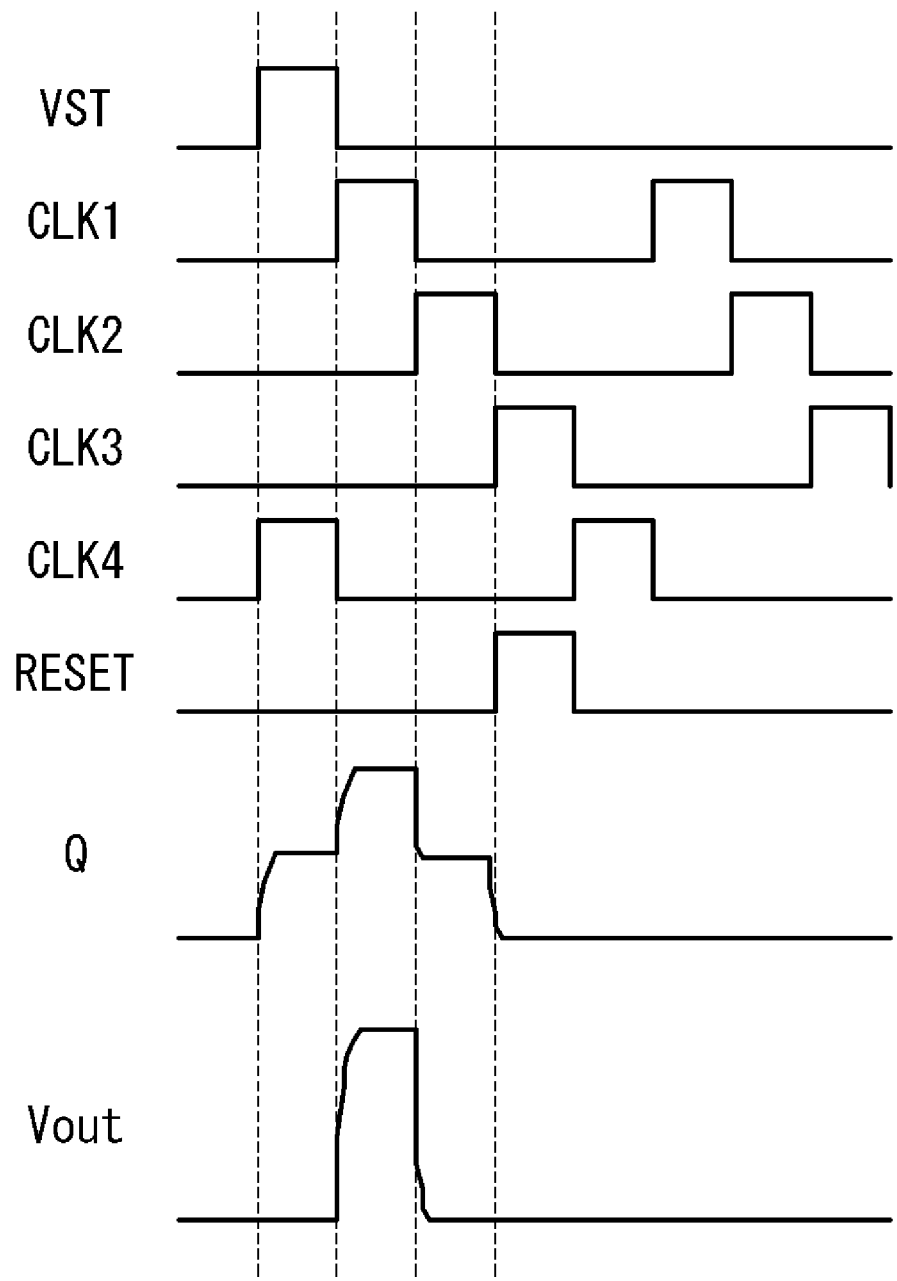
FIG. 9 is a timing diagram illustrating a change in a voltage of a main node of a stage during a display period.
Figure 10:
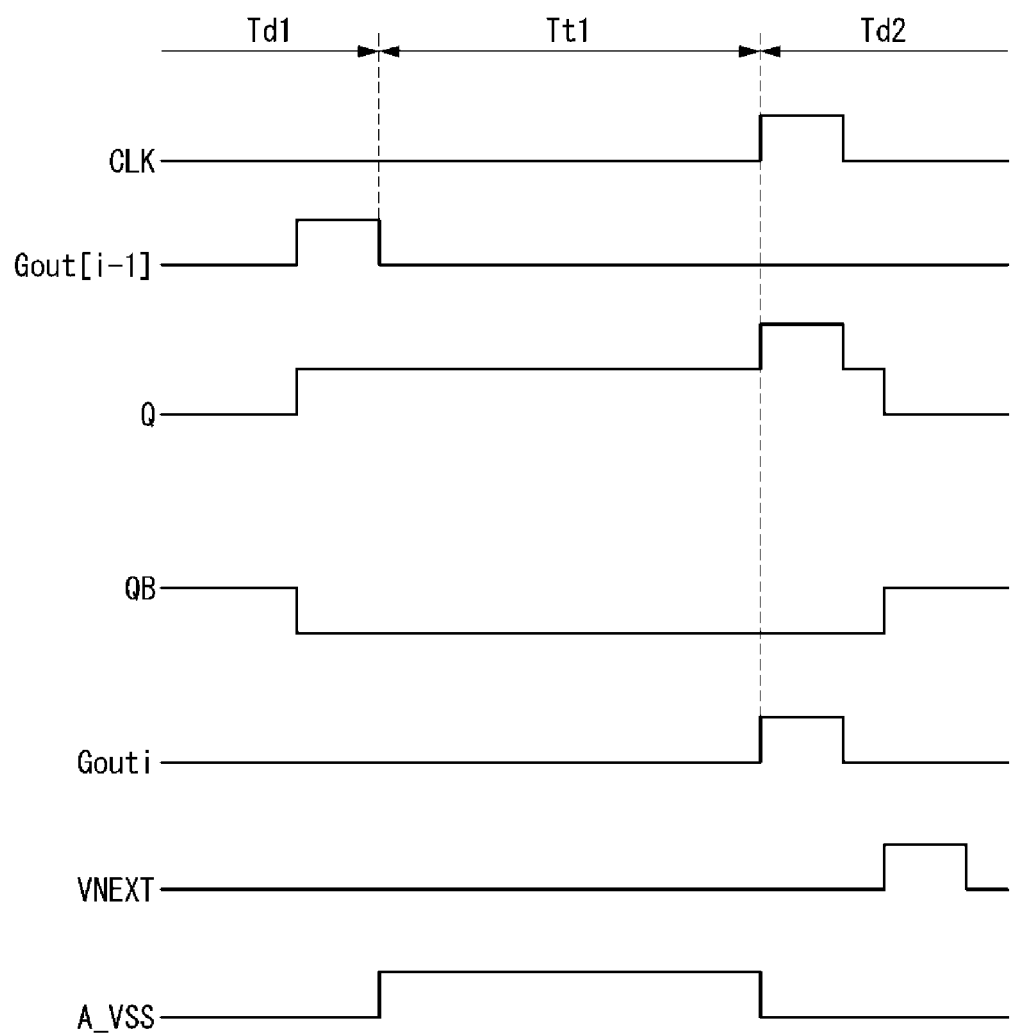
FIG. 10 is a timing diagram illustrating a change in a voltage of a main node of a stage during a touch sensing period.

FIG. 9 is a timing diagram illustrating a change in a voltage of a main node of a stage during a display period. FIG. 10 is a timing diagram illustrating a change in a voltage of a main node of a stage during a touch sensing period.

A voltage change in the node of the $(i-1)^{th}$ stage shown in FIG. 7 and a voltage change in the node of the $i^{th}$ stage shown in FIG. 8 are described with reference to FIGS. 9 and 10. An operation of an $(i-1)^{th}$ stage and an operation of an $i^{th}$ stage are described with reference to FIGS. 6 to 9.

A first transistor T1 of an $(i-1)^{th}$ stage STG[i−1] may pre-charge the Q node in response to the start pulse VST. After the start pulse VST is completed, a pull-up transistor Tpu of the $(i-1)^{th}$ stage STG[i−1] may receive the gate clock CLK. A voltage of a drain electrode of the pull-up transistor Tpu may rise by the gate clock CLK, and thus the Q node, which may be a gate electrode of the pull-up transistor Tpu, may be bootstrapped. When a gate-to-source voltage of the pull-up transistor Tpu reaches a threshold voltage Vth in a process for bootstrapping the Q node, the pull-up transistor Tpu may be turned on. As a result, a voltage of an output terminal Nout may rise, and the $(i-1)^{th}$ gate pulse Gout[i−1] may be applied to the $(i-1)^{th}$ gate line connected to the output terminal Nout.

When a first gate clock CLK1 is inverted to the low potential voltage, a voltage level of the output terminal Nout may also be reduced. Thereafter, when the reset signal RESET is applied, a second discharge controller T4 of the $(i-1)^{th}$ stage STG[i−1] may be turned on in response to the reset signal RESET, and may discharges the voltage of the Q node to the low potential voltage.

The $(i-1)^{th}$ gate pulse Gout[i-1] output during a first display period Td1 may be applied to the start signal input terminal VST_P of the $i^{th}$ stage STG[i]. The first transistor T1 of the $i^{th}$ stage STG[i] may charge the Q node in response to the $(i-1)^{th}$ gate pulse Gout[i-1]. Before the $i^{th}$ stage STG[i] outputs the $i^{th}$ gate pulse Gout[i], the touch sensing circuit 150 may drive the touch sensors TS during the first touch sensing period Tt1. After the first touch sensing period Tt1 ends, the $i^{th}$ stage STG[i] may receive the gate clock CLK, and may output the $i^{th}$ gate pulse Gout[i].

The $i^{th}$ stage STG[i] may receive the gate clock CLK after the first touch sensing period Tt1 has passed from a pre-charged state of the Q node. When the Q node of the $i^{th}$ stage STG[i] is in a floating state during the first touch sensing period Tt1, the Q node may be discharged via the first and second discharge controllers T2 and T4.

Such operation will be described as follows. When a gate-to-source voltage Vgs of a transistor is less than a threshold voltage Vth, the transistor is turned off. Even if the transistor is turned off, a current path between a drain and a source of the transistor may not be completely blocked, and the current may flow in a small amount. The current flowing when the gate-to-source voltage Vgs of the transistor is equal to or less than the threshold voltage Vth is referred to as a "leakage current." The leakage current may also increase as a voltage difference Vds between the drain and source of the transistor increases.

To prevent the leakage current, the variable low potential voltage line A_VSS_L according to the first embodiment may receive the high potential voltage during the first touch sensing period Tt1. For example, the variable low potential voltage line A_VSS_L may receive the gate high voltage VGH during the first touch sensing period Tt1.

When the gate high voltage VGH is applied to the variable low potential voltage line A_VSS_L during the first touch sensing period Tt1, source voltages of the first discharge controller T2 and the second discharge controller T4 may become the gate high voltage VGH. As a result, the voltage of the Q node may not be discharged via the first discharge controller T2 and the second discharge controller T4, and a direction of the leakage current of the first discharge controller T2 and the second discharge controller T4 may be formed as a direction to charge the Q node. As described above, the shift register according to the first embodiment can prevent the voltage of the Q node from being discharged via the first discharge controller T2 and the second discharge controller T4 during the first touch sensing period Tt1.

The Q node of the $i^{th}$ stage STG[i] may maintain the pre-charged state during the first touch sensing period Tt1, and may receive the gate clock CLK when the second display period Td2 starts. The pull-up transistor of the $i^{th}$ stage STG[i] may receive the gate clock CLK to increase the voltage of the output terminal Nout and to output the $i^{th}$ gate pulse Gout[i].

The shift register according to the first embodiment may prevent the Q node from being discharged during the touch sensing period Tt. Thus, as shown in the FIG. 6 example, the variable low potential voltage line A_VSS_L may be connected only to the first stage of each panel block PB.

Figure 11:
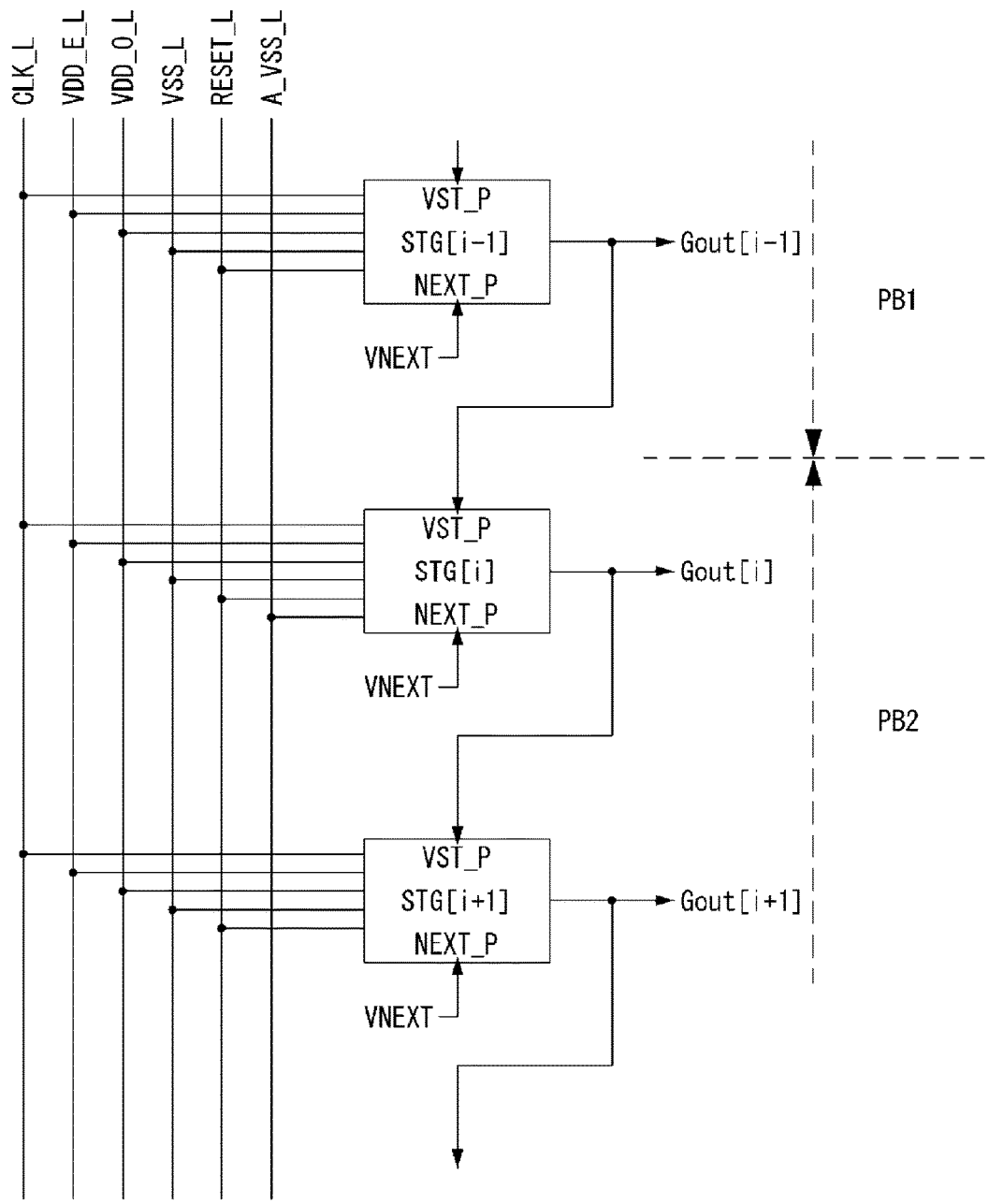
FIG. 11 illustrates a stage according to a second example embodiment.

FIG. 11 illustrates a stage according to a second example embodiment.

With reference to FIG. 11, which is an example of an $i^{th}$ stage according to a second example embodiment, a shift register 140 according to a second example embodiment may output a gate pulse in response to gate clocks CLK and a start pulse VST. The shift register 140 may include a plurality of cascade-connected stages. Structures and components identical or equivalent to those illustrated in the first embodiment are designated with the same reference numerals in the second embodiment, and a further description may be briefly made or may be entirely omitted.

An $i^{th}$ stage STG[i] according to the second example embodiment may include a pull-up transistor Tpu, a pull-down transistor Tpd, a first transistor T1, Q node discharge controllers T2, T3, and T4, and a node control circuit NCON. The Q node discharge controllers T2, T3, and T4 may include a first discharge controller T2, a second discharge controller T4, and a third discharge controller T3. The third discharge controller T3 may form a current path between a Q node and a variable low potential voltage line A_VSS_L in response to a voltage of a QB node. The third discharge controller T3 may be connected to the variable low potential voltage line A_VSS_L through a diode Di. An anode electrode of the diode Di may be connected to a source electrode of the third discharge controller T3, and a cathode electrode of the diode Di may be connected to the variable low potential voltage line A_VSS_L.

Diodes Di disposed in stages STG, other than the $i^{th}$ stage STG[i], may discharge the Q node during the display period Td. Such operation is described as follows. In the second embodiment, the variable low potential voltage line A_VSS_L may be connected to a first stage of each panel block PB. Therefore, during the touch sensing period Tt, not only the $i^{th}$ stage STG[i] normally outputting the gate pulse, but also the Q nodes of the stages connected to the variable low potential voltage line A_VSS_L, may all be charged. As a result, when the touch sensing period Tt ends and the display period Td starts, the stages STG other than the $i^{th}$ stage STG[i] may output the gate pulse when the gate clock is input. In this instance, an erroneous operation may occur in which undesired gate pulses except an $i^{th}$ gate pulse Gout[i] are output.

On the other hand, the diode Di may form a current path for discharging the voltage of the Q node when a variable low potential voltage A_VSS is inverted to the low potential voltage VSS in the display period Td. For example, as a leakage current of the third discharge controller T3 flows into the variable low potential voltage line A_VSS_L via the diode Di, a high voltage of the Q node may be discharged. As a result, the diode Di can prevent the stages other than the $i^{th}$ stage STG[i] from outputting an abnormal gate pulse. An operation for outputting the gate pulse by the shift register according to the second embodiment is substantially similar to the first embodiment.

Figure 13:
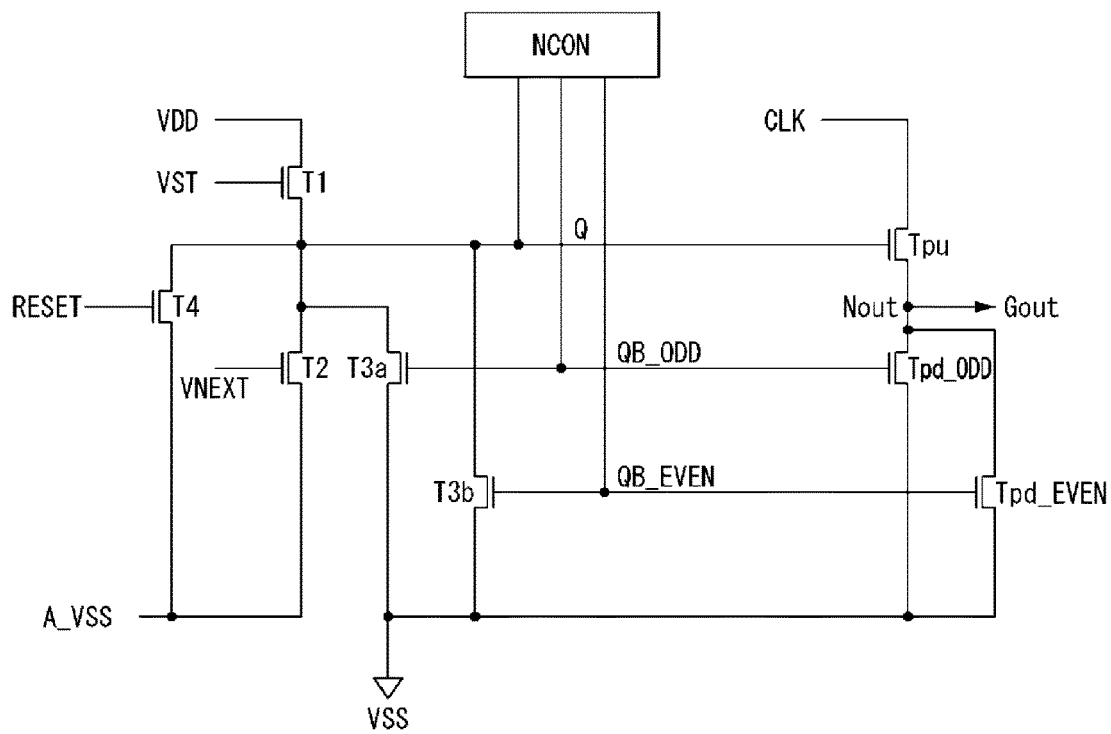
FIG. 13 illustrates a stage according to a third example embodiment.
Figure 14:
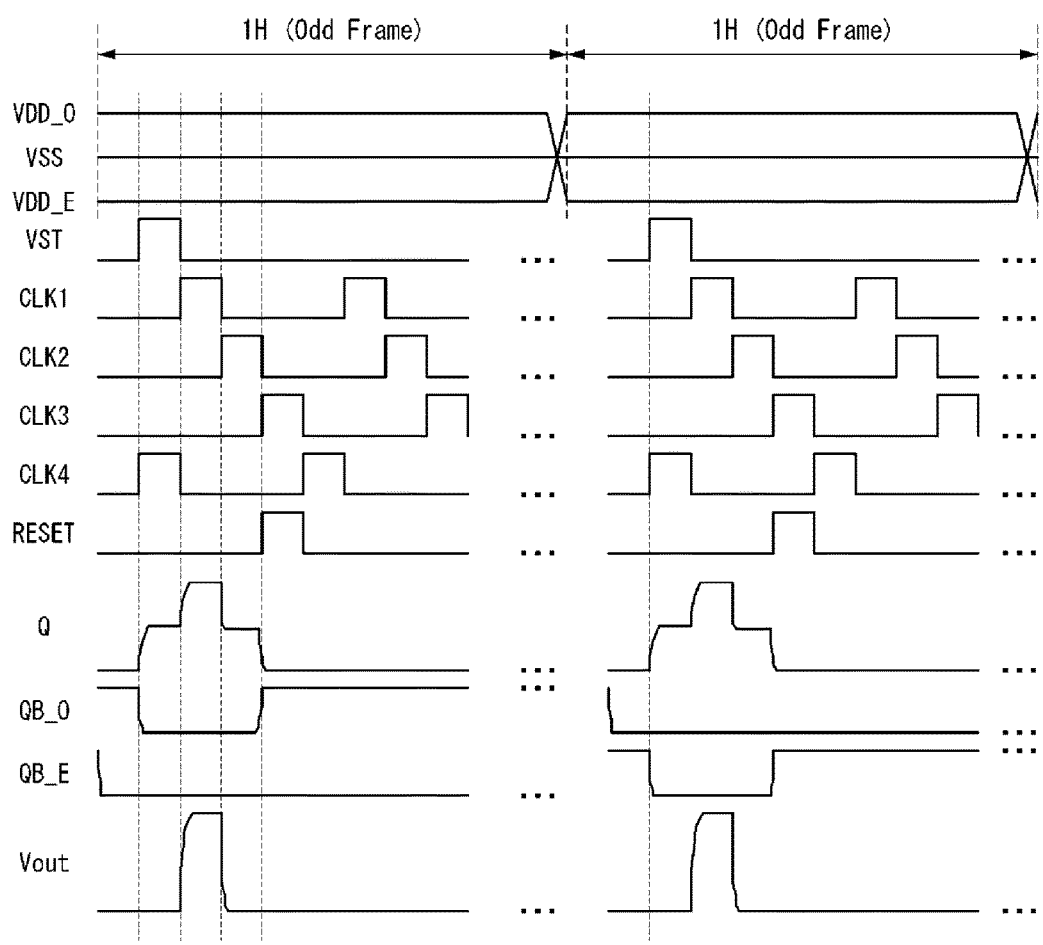
FIG. 14 is a timing diagram illustrating a change in a voltage of a main node of a stage shown in FIG. 13.

FIG. 13 illustrates a stage according to a third example embodiment. FIG. 14 is a timing diagram illustrating a change in a voltage of a main node of a stage shown in FIG. 13.

With reference to FIGS. 13 and 14, a shift register 140 according to a third example embodiment may output a gate pulse in response to gate clocks CLK and a start pulse VST. The shift register 140 may include a plurality of cascade-connected stages. Structures and components identical or equivalent to those illustrated in the first and second embodiments are designated with the same reference numerals in the third embodiment, and a further description may be briefly made or may be entirely omitted.

The shift register 140 according to the third embodiment may be connected to a first high potential voltage line VDD_O_L and a second high potential voltage line VDD_E_L for alternately charging a first QB node QB_ODD and a second QB node QB_EVEN. The first high potential voltage line VDD_O_L may apply a high potential voltage during odd-numbered frames ODD FRAME, and may hold a low potential voltage during even-numbered frames EVEN FRAME. The second high potential voltage line VDD_E_L may apply the high potential voltage during the even-numbered frames EVEN FRAME, and may hold the low potential voltage during the odd-numbered frames ODD FRAME.

An $i^{th}$ stage STG[i] according to the third embodiment may include a pull-up transistor Tpu, an odd pull-down transistor Tpd_ODD, an even pull-down transistor Tpd_EVEN, a first transistor T1, Q node discharge controllers T2 and T4, a 3a transistor T3a, a 3b transistor T3b, and a node control circuit NCON.

The odd pull-down transistor Tpd_ODD may include a gate electrode connected to the first QB node QB_ODD, a drain electrode connected to an output terminal, and a source electrode connected to a low potential voltage line VSS_L. The even pull-down transistor Tpd_EVEN may include a gate electrode connected to the second QB node QB_EVEN, a drain electrode connected to the output terminal, and a source electrode connected to the low potential voltage line VSS_L.

In the first and second embodiments, the pull-down transistor may maintain the high potential voltage in almost all the periods except the period in which the Q node is charged. Hence, a DC gate bias stress of the pull-down transistor may increase, and the threshold voltage may be shifted due to an increase in the DC gate bias stress. To solve this problem, the shift register according to the third embodiment may dispose the two QB nodes QB_ODD and QB_EVEN, and may alternately charge the first and second QB nodes QB_ODD and QB_EVEN. For example, the node control circuit NCON may charge the first QB node QB_ODD in the odd-numbered frames ODD FRAME, and may charge the second QB node QB_EVEN in the even-numbered frames EVEN FRAME. An operation of the shift register in each frame may be substantially similar to the operation of the shift register according to the first embodiment described above. The stage according to the third embodiment may apply the high potential voltage to a variable low potential voltage line A_VS S_L during a touch sensing period Tt to prevent the Q node from being discharged, in a similar manner to the first embodiment.

Figure 15:
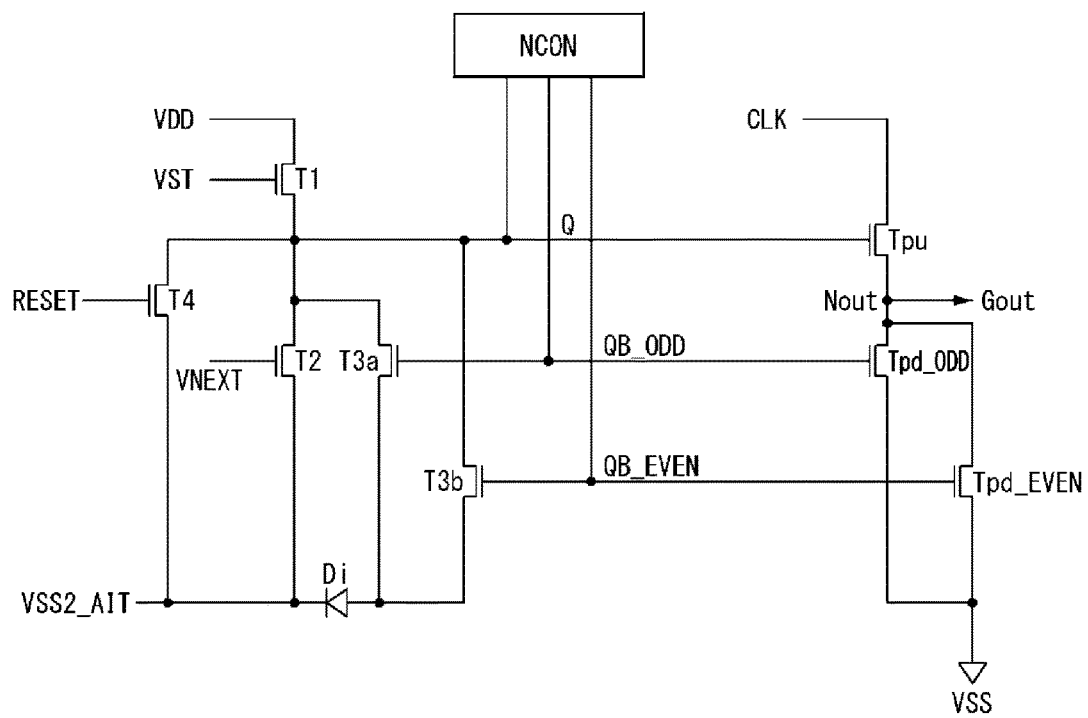
FIG. 15 illustrates a stage according to a fourth example embodiment.

FIG. 15 illustrates a stage according to a fourth example embodiment.

Figure 12:
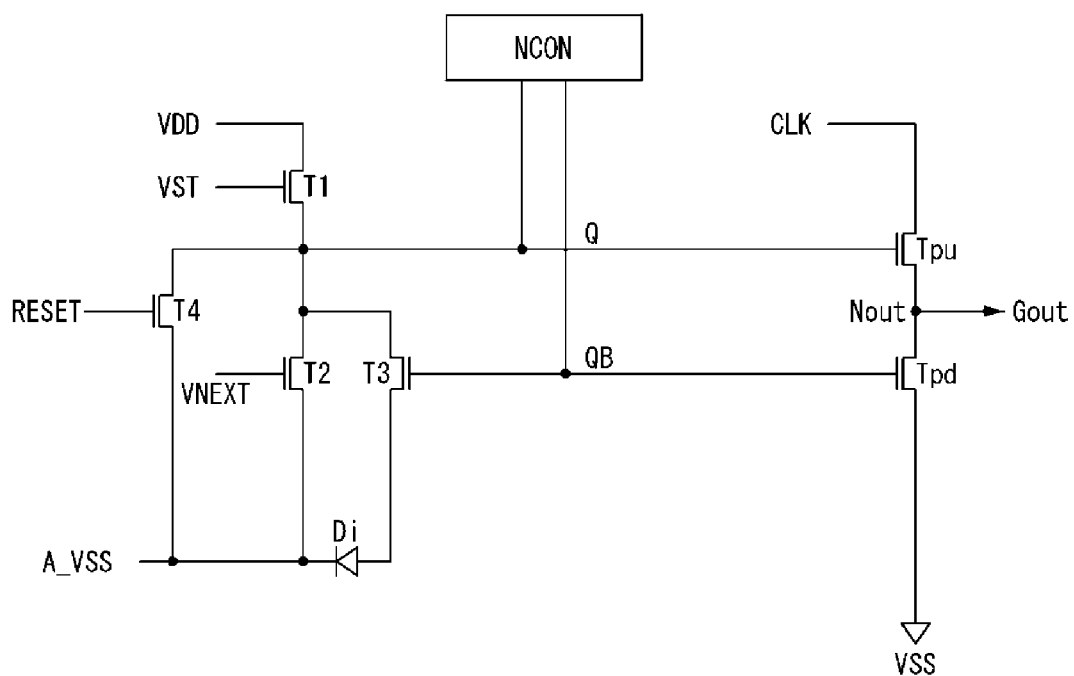
FIG. 12 illustrates a shift register according to a third example embodiment.

For example, FIG. 15 is a modified example of the stage according to the third embodiment described above, and a connection relationship of the stages shown in FIG. 15 is substantially similar to that of the shift register according to the third embodiment shown in FIG. 12. Further, driving signals for driving the stage according to the fourth embodiment are substantially similar to those of the third embodiment. Structures and components identical or equivalent to those illustrated in the first to third embodiments are designated with the same reference numerals in the fourth embodiment, and a further description may be briefly made or may be entirely omitted.

An $i^{th}$ stage STG[i] according to the fourth embodiment may include a pull-up transistor Tpu, an odd pull-down transistor Tpd_ODD, an even pull-down transistor Tpd_EVEN, a first transistor T1, Q node discharge controllers T2, T4, T3a, and T3b, and a node control circuit NCON.

The Q node discharge controllers T2, T4, T3a, and T3b may include a first discharge controller T2, a second discharge controller T4, a third discharge controller T3a, and a fourth discharge controller T3b.

The third discharge controller T3a and the fourth discharge controller T3b according to the fourth embodiment may be connected to a variable low potential voltage line A_VSS_L through a diode Di. An anode electrode of the diode Di may be connected to a source electrode of the third discharge controller T3a and a source electrode of the fourth discharge controller T3b, and a cathode electrode of the diode Di may be connected to the variable low potential voltage line A_VSS_L. The diode Di according to the fourth embodiment can prevent Q nodes of stages other than the $i^{th}$ stage STG[i] outputting a gate pulse from being charged, in a similar manner as the second embodiment.

Figure 16:
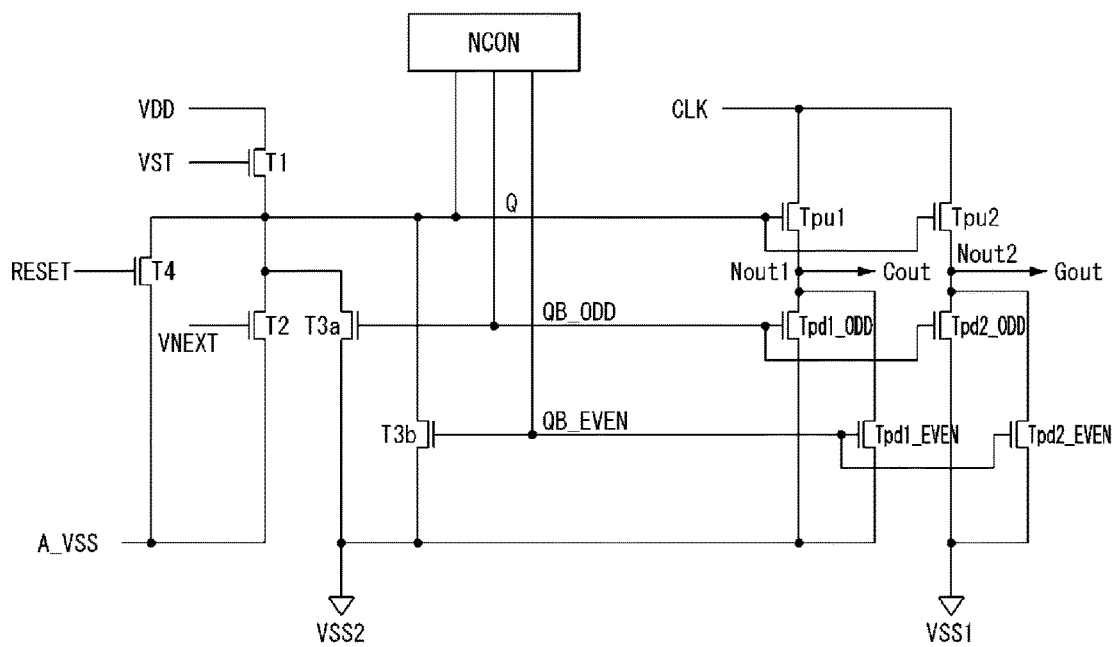
FIG. 16 illustrates a stage according to a fifth example embodiment.

FIG. 16 illustrates a stage according to a fifth example embodiment.

With reference to FIG. 16, an $i^{th}$ stage STG[i] according to the fifth embodiment may include first and second pull-up transistors Tpu1 and Tpu2, a first odd pull-down transistor Tpd1_ODD, a first even pull-down transistor Tpd1_EVEN, a second odd pull-down transistor Tpd2_ODD, a second even pull-down transistor Tpd2_EVEN, a first transistor T1, Q node discharge controllers T2 and T4, a 3a transistor T3a, a 3b transistor T3b, and a node control circuit NCON. Structures and components identical or equivalent to those illustrated in the above-described embodiments are designated with the same reference numerals in the fifth embodiment, and a further description may be briefly made or may be entirely omitted.

The Q node discharge controllers T2 and T4 may include a first discharge controller T2 and a second discharge controller T4. The first pull-up transistor Tpu1 may include a gate electrode connected to a Q node, a drain electrode connected to a gate clock line CLK_L, and a source electrode connected to a first output terminal Nout1. The second pull-up transistor Tpu2 may include a gate electrode connected to the Q node, a drain electrode connected to the gate clock line CLK_L, and a source electrode connected to a second output terminal Nout2.

The first odd pull-down transistor Tpd1_ODD may include a gate electrode connected to a first QB node QB_ODD, a drain electrode connected to the first output terminal Nout1, and a source electrode connected to a second low potential voltage line VSS_L. The first even pull-down transistor Tpd1_EVEN may include a gate electrode connected to a second QB node QB_EVEN, a drain electrode connected to the first output terminal Nout1, and a source electrode connected to the second low potential voltage line VSS_L.

The second odd pull-down transistor Tpd2_ODD may include a gate electrode connected to the first QB node QB_ODD, a drain electrode connected to the second output terminal Nout2, and a source electrode connected to a first low potential voltage line VSS_L. The second even pull-down transistor Tpd2_EVEN may include a gate electrode connected to the second QB node QB_EVEN, a drain electrode connected to the second output terminal Nout2, and a source electrode connected to the first low potential voltage line VSS_L.

The first output terminal Nout1 may output a carry signal Cout, and the carry signal Cout may be applied to a subsequent stage. The second output terminal Nout2 may output a gate pulse Gout, and the gate pulse Gout may be applied to the gate line GL. The carry signal Cout and the gate pulse Gout output from the same stage may have the same output timing. As described above, the shift register according to the fifth embodiment may separate the gate pulse Gout and the carry signal Cout from each other through the two output terminals.

A gate low voltage of a gate clock CLK applied to the shift register 140 according to the fifth embodiment may be equal to a second low potential voltage VSS2. The second low potential voltage VSS2 may be set to a voltage level less than a first low potential voltage VSS1. The fifth embodiment can reduce a falling time of each of the gate pulse Gout and the carry signal Cout due to the under-driving effect obtained by reducing a voltage level of the gate clock CLK. A voltage of the second output terminal Nout2 may be instantaneously reduced to the first low potential voltage VSS1 at the falling time of the gate pulse Gout, but may be held at the first low potential voltage VSS1 as the second odd pull-down transistor Tpd2_ODD or the second even pull-down transistor Tpd2_EVEN operates. When a gate low voltage of the gate pulse Gout applied to the display panel 100 is held at a very low voltage, the transistor of the display panel 100 may malfunction. Thus, the fifth embodiment can prevent an erroneous operation generated by reducing the gate low voltage of the gate pulse Gout while obtaining the under-driving effect. The Q node discharge controllers T2 and T4 according to the fifth embodiment can prevent the Q node from being discharged during a touch sensing period Tt.

Figure 17:
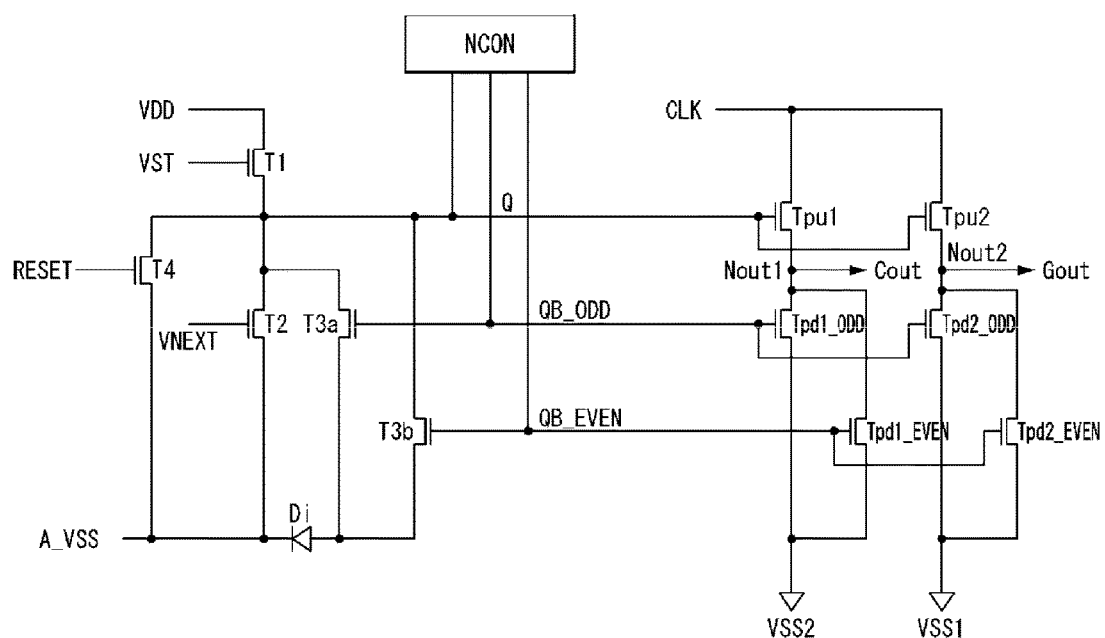
FIG. 17 illustrates a stage according to a sixth example embodiment.

FIG. 17 illustrates a stage according to a sixth example embodiment.

For example, FIG. 17 is a modified example of the stage according to the fifth embodiment described above. With reference to FIG. 17, an $i^{th}$ stage STG[i] according to the sixth embodiment may include first and second pull-up transistors Tpu1 and Tpu2, a first odd pull-down transistor Tpd1_ODD, a first even pull-down transistor Tpd1_EVEN, a second odd pull-down transistor Tpd2_ODD, a second even pull-down transistor Tpd2_EVEN, a first transistor T1, Q node discharge controllers T2, T4, T3a and T3b, and a node control circuit NCON. Structures and components identical or equivalent to those illustrated in the above-described embodiments are designated with the same reference numerals in the sixth embodiment, and a further description may be briefly made or may be entirely omitted.

The Q node discharge controllers T2, T4, T3a, and T3b may include a first discharge controller T2, a second discharge controller T4, a third discharge controller T3a, a fourth discharge controller T3b, and a diode Di. The third discharge controller T3a and the fourth discharge controller T3b may be connected to a variable low potential voltage line A_VSS_L through the diode Di. An anode electrode of the diode Di may be connected to a source electrode of the third discharge controller T3a and a source electrode of the fourth discharge controller T3b, and a cathode electrode of the diode Di may be connected to the variable low potential voltage line A_VSS_L.

The Q node discharge controllers T2, T4, T3a, and T3b according to the sixth embodiment can prevent a voltage of a Q node from being discharged during a touch sensing period Tt. In particular, the diode Di according to the sixth embodiment can prevent stages other than a stage outputting a gate pulse from outputting the gate pulse.

Figure 18:
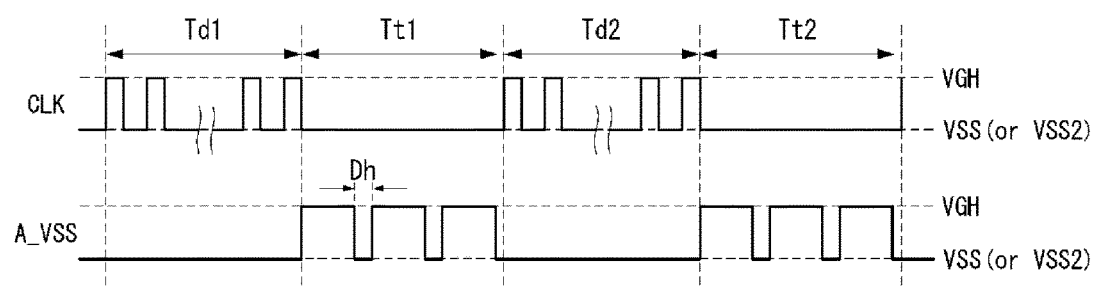
FIG. 18 is a timing diagram illustrating a variable low potential voltage according to a second example embodiment.

FIG. 18 is a timing diagram illustrating a variable low potential voltage according to a second example embodiment.

FIG. 18 illustrates a variable low potential voltage according to another example embodiment. The variable low potential voltage A_VSS (e.g., as shown in FIGS. 10 and 18) may be held at the gate high voltage VGH during the touch sensing period Tt. As shown in FIG. 10, when the variable low potential voltage A_VSS is held at the gate high voltage VGH during the touch sensing period Tt, the Q node of the $i^{th}$ stage STG[i] can be efficiently prevented from being discharged.

It some embodiments, although not required, Q nodes of stages other than the $i^{th}$ stage STG[i] outputting the gate pulse are held at the low potential voltage during a drive of the $i^{th}$ stage STG[i] outputting the gate pulse. However, the variable low potential voltage line A_VSS_L may be connected to a first stage of each panel block as well as the $i^{th}$ stage STG[i]. When the gate high voltage VGH is applied to the variable low potential voltage line A_VSS_L due to the structure of the shift register, the Q nodes of the stages other than the $i^{th}$ stage STG[i] may be charged and may output two or more gate pulses.

To prevent the multi-output of the gate pulse, the Q node may be discharged using the diode during the display period as shown in FIGS. 11, 15, and 17. With reference to FIG. 18, as another method for preventing the multi-output of the gate pulse, an output of the variable low potential voltage line A_VSS_L may fall to the low potential voltage VSS in a predetermined cycle. As described above, an amount of the Q node charged via the Q node discharge controller may be adjusted due to a pause period Dh in which the variable low potential voltage A_VSS is reduced in the touch sensing period Tt. As a result, an operation of the pull-up transistor connected to the Q node of each stage can be suppressed, and the multi-output of the gate pulse can be prevented.

Figure 19:
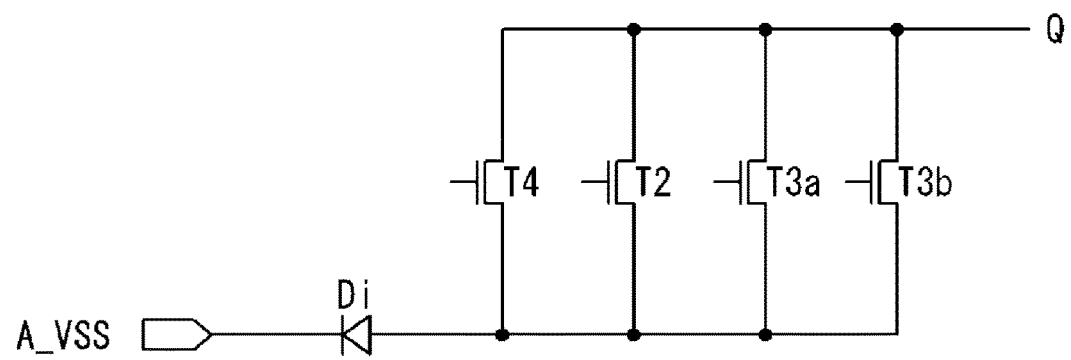
FIG. 19 illustrates a Q node discharge controller according to another example embodiment.

FIG. 19 illustrates a Q node discharge controller according to another example embodiment.

With reference to FIG. 19, Q node discharge controllers T2, T4, T3a, and T3b according to another example embodiment may include a first discharge controller T2, a second discharge controller T4, a third discharge controller T3a, a fourth discharge controller T3b, and a diode Di. A cathode electrode of the diode Di of the Q node discharge controller shown in FIG. 19 may be connected to the variable low potential voltage line A_VSS_L, and an anode electrode of the diode Di may be connected to source electrodes of all of transistors connected to the Q node. As a result, a leakage current of the Q node discharge controllers T2, T4, T3a, and T3b may flow from the variable low potential voltage line A_VSS_L to the Q node during the touch sensing period Tt, and the Q node may be charged.

Further, when the variable low potential voltage A_VSS is the low potential voltage VSS, the voltage of the Q node may be discharged using a leakage current of the Q node discharge controllers T2, T4, T3a, and T3b flowing in the opposite direction of the leakage current flowing in the touch sensing period Tt. Hence, the multi-output of the gate pulse can be prevented.

FIG. 19 illustrates a stage in which the QB nodes are alternately driven, as an example. However, the diode shown in FIG. 19 may be applied to a stage using one QB node. The diode Di of the Q node discharge controller of FIG. 19 may be applied, e.g., to the first embodiment illustrated in FIG. 8. For example, when the transistor included in the Q node discharge controller is the first discharge controller T2 and the second discharge controller T4, the diode Di may be connected to a source electrode of each of the first discharge controller T2 and the second discharge controller T4. The diode, e.g., diode Di, illustrated in FIGS. 11, 15, and 17 may be added to the embodiment illustrated in FIG. 19.

Figure 20:
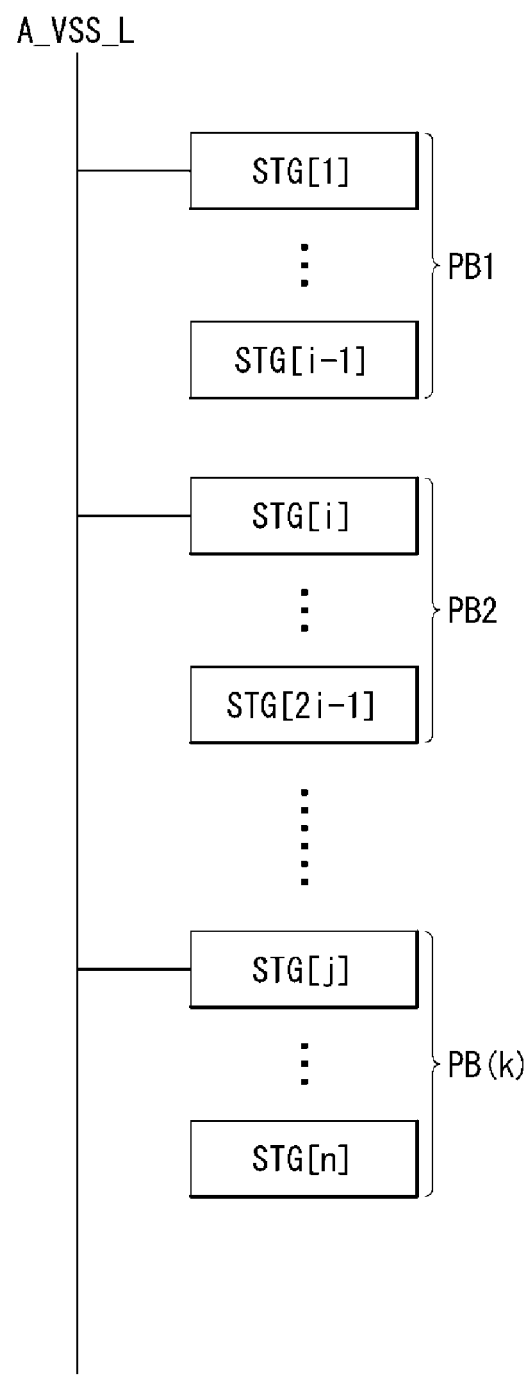
FIGS. 20 and 21 illustrate a connection relationship between a shift register and a variable low potential voltage line.
Figure 21:
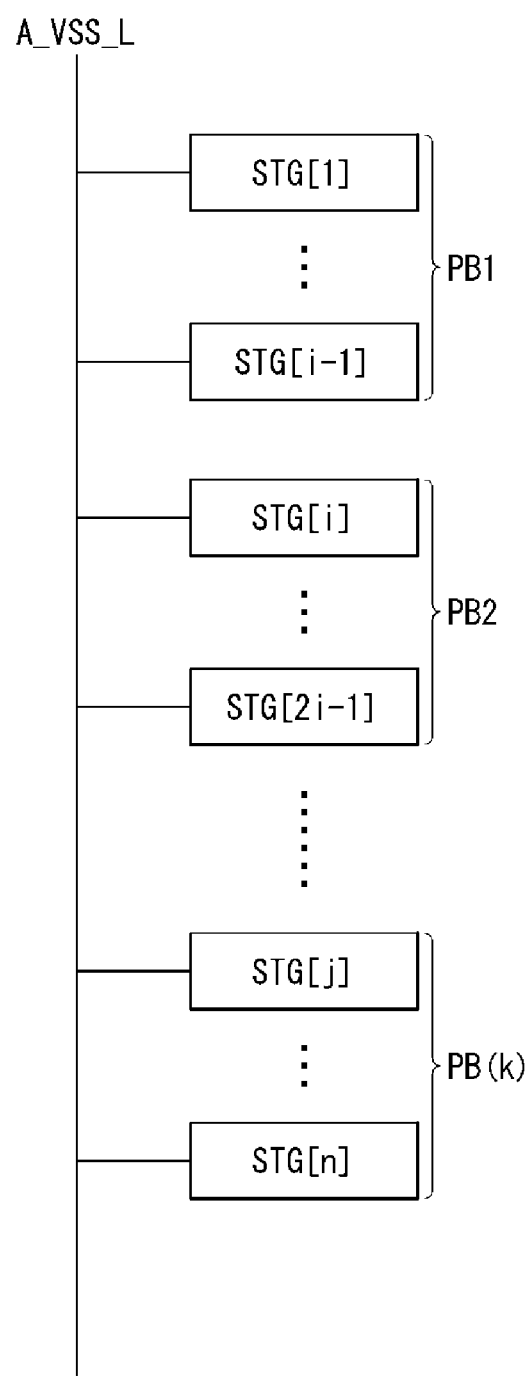

FIGS. 20 and 21 illustrate a connection relationship between a shift register and a variable low potential voltage line.

FIG. 20 illustrates a connection relationship between a shift register and a variable low potential voltage line according to the first embodiment. With reference to FIG. 20, the Q node discharge controller connected to the variable low potential voltage line A_VSS_L may be arranged only on a first stage of each panel block PB. However, when the stages connected to the variable low potential voltage line A_VSS_L are limited as shown in FIG. 20, the panel blocks PB may not vary.

Figure 22:
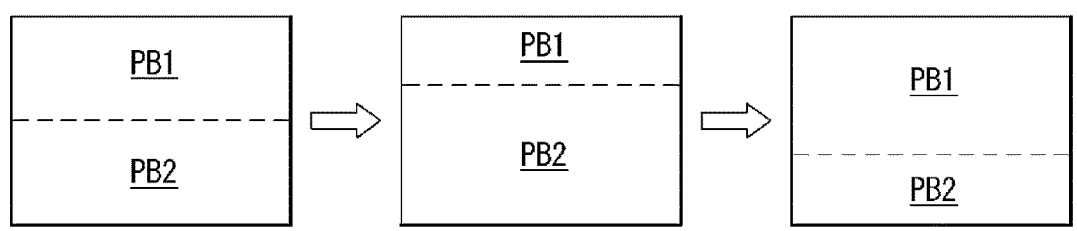
FIG. 22 illustrates an example of varying a panel block in a structure shown in FIG. 21.

FIG. 21 illustrates a connection relationship between a shift register and a variable low potential voltage line according to the second embodiment. With reference to FIG. 21, the variable low potential voltage line A_VSS_L may be connected to all the stages. For example, all the stages can prevent the Q node from being discharged during the touch sensing period Tt using the Q node discharge controller. As described above, when the stage structure and the variable low potential voltage line according to the embodiments are applied to all the stages, the panel block may vary. Thus, because the touch sensing period and the display period are not limited to specific timing, embodiments are applicable to a display device having different line sizes of panel blocks. In addition, as shown in FIG. 22, embodiments are also applicable to a display device in which a panel blocks frequently vary and are driven. When the panel blocks frequently vary and are driven as shown in the FIG. 22 example, a position of the line dim generated at each boundary between the panel blocks may frequently vary, thereby improving the display quality of the image.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A touch sensor integrated type display device, comprising:
   a display panel including:
      pixels connected to data lines and gate lines and division-driven into a plurality of panel blocks; and
      a plurality of touch sensors connected to the pixels;
   a display driving circuit configured to provide data of an input image to the pixels in a plurality of display periods divided from one frame period; and
   a touch sensing circuit configured to drive the touch sensors and sense a touch input in a touch sensing period allocated between the display periods of the one frame period,
   wherein adjacent panel blocks of the display panel are division-driven in the display periods that are separated from each other with the touch sensing period, in which the touch sensors are driven, interposed therebetween,
   wherein the display driving circuit includes a shift register configured to:
      shift a gate pulse in accordance with a shift clock timing, and
      sequentially supply the gate pulse to the gate lines,
   wherein an $i^{th}$ stage of the shift register includes:
      a first pull-up transistor configured to increase a voltage of a first output terminal in response to a voltage of a Q node,
      a first pull-down transistor configured to discharge the voltage of the first output terminal to a first low potential voltage in response to a voltage of a QB node,
      a first transistor configured to charge the Q node in response to a voltage of a start pulse input terminal, and
      a first discharge controller configured to discharge the Q node in response to a next signal in the display period; and
      a second discharge controller configured to discharge the Q node in response to a reset signal input to a driving circuit outside the display panel in the display period,
   where "i" is a natural number, and
   wherein a variable low potential voltage line is configured to receive a high potential voltage during at least a portion of the touch sensing period and receive a low potential voltage during the display period.

2. The device of claim 1, wherein the Q node discharge controller further includes a diode including:
   an anode electrode connected to a source electrode of the transistor included in the Q node discharge controller; and
   a cathode electrode connected to the variable low potential voltage line.

3. The device of claim 1, wherein the Q node discharge controller further includes:
   a diode including an anode electrode connected to the variable low potential voltage line; and
   a third discharge controller including:
      a gate electrode connected to the QB node;
      a drain electrode connected to the Q node; and
      a source electrode connected to a cathode electrode of the diode.

4. The device of claim 3, wherein the $i^{th}$ stage of the shift register further includes:
   a second pull-up transistor configured to increase a voltage of a second output terminal in response to the voltage of the Q node; and
   a second pull-down transistor configured to discharge the voltage of the second output terminal to a second low potential voltage in response to the voltage of the QB node,
   wherein a gate low voltage of a gate clock applied to drain electrodes of the first and second pull-up transistors is the same as a first low potential voltage.

5. The device of claim 4, wherein the second low potential voltage is less than the first low potential voltage.

6. The device of claim 5, wherein the variable low potential voltage line is configured to be held at the second low potential voltage during the display period.

7. The device of claim 1, wherein the variable low potential voltage line is further configured to receive a low potential voltage during a predetermined pause period of the touch sensing period.

8. The device of claim 1, wherein the variable low potential voltage line is connected to all stages of the panel blocks.

9. A method of operating a touch sensor integrated type display device including a display panel including pixels connected to data lines and gate lines and division-driven into a plurality of panel blocks and a plurality of touch sensors connected to the pixels, the method comprising:
   providing, by a display driving circuit, data of an input image to the pixels in a plurality of display periods divided from one frame period;
   driving the touch sensors and sensing a touch input in a touch sensing period allocated between the display periods of the one frame period, by a touch sensing circuit;

division-driving adjacent panel blocks of the display panel in the display periods that are separated from each other with the touch sensing period, in which the touch sensors are driven, interposed therebetween;
by a shift register in the display driving circuit:
shifting a gate pulse in accordance with a shift clock timing; and
sequentially supplying the gate pulse to the gate lines;
increasing a voltage of a first output terminal in response to a voltage of a Q node, by a first pull-up transistor in an $i^{th}$ stage of the shift register, where "i" is a natural number;
discharging the voltage of the first output terminal to a first low potential voltage in response to a voltage of a QB node, by a first pull-down transistor in the $i^{th}$ stage of the shift register;
charging the Q node in response to a voltage of a start pulse input terminal, by a first transistor in the $i^{th}$ stage of the shift register;
controlling a current path between the Q node and a variable low potential voltage line;
by the first discharge controller, discharging the Q node in response to a next signal in the display period;
by a second discharge controller, discharging the Q node in response to a reset signal input to a driving circuit outside the display panel in the display period; and
receiving, by the variable low potential voltage line[H]:
a high potential voltage during at least a portion of the touch sensing period; and
a low potential voltage during the display period.

10. The method of claim 9, wherein the Q node discharge controller further includes a diode including:
an anode electrode connected to a source electrode of the transistor included in the Q node discharge controller; and
a cathode electrode connected to the variable low potential voltage line.

11. The method of claim 9, wherein the Q node discharge controller further includes:
a diode including an anode electrode connected to the variable low potential voltage line; and
a third discharge controller including:
a gate electrode connected to the QB node;
a drain electrode connected to the Q node; and
a source electrode connected to a cathode electrode of the diode.

12. The method of claim 11, further comprising:
by a second pull-up transistor in the $i^{th}$ stage of the shift register, increasing a voltage of a second output terminal in response to the voltage of the Q node; and
by a second pull-down transistor in the $i^{th}$ stage of the shift register, discharging the voltage of the second output terminal to a second low potential voltage in response to the voltage of the QB node,
wherein a gate low voltage of a gate clock applied to drain electrodes of the first and second pull-up transistors is the same as a first low potential voltage.

13. The method of claim 12, wherein the second low potential voltage is less than the first low potential voltage.

14. The method of claim 13, further comprising holding the variable low potential voltage line at the second low potential voltage during the display period.

15. The method of claim 9, further comprising, by the variable low potential voltage line, receiving a low potential voltage during a predetermined pause period of the touch sensing period.

16. The method of claim 9, wherein the variable low potential voltage line is connected to all stages of the panel blocks.

* * * * *